United States Patent
Mimachi et al.

(10) Patent No.: US 6,392,569 B1
(45) Date of Patent: May 21, 2002

(54) DECODING APPARATUS, DATA REPRODUCTION APPARATUS, AND DECODING METHOD

(75) Inventors: Nobumasa Mimachi, Kanagawa; Minoru Hashimoto, Tokyo; Hiromasa Kimura, Saitama, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/484,968

(22) Filed: Jan. 18, 2000

(30) Foreign Application Priority Data

Jan. 19, 1999 (JP) .......................................... 11-011142

(51) Int. Cl.[7] .............................................. H03M 5/00
(52) U.S. Cl. ........................................ 341/58; 341/94
(58) Field of Search .............................. 341/59, 53, 58, 341/69; 371/402; 395/430

(56) References Cited

U.S. PATENT DOCUMENTS

| | | | | |
|---|---|---|---|---|
| 5,638,064 A | * | 6/1997 | Mori et al. ................... | 341/58 |
| 5,640,160 A | * | 6/1997 | Miwa ........................... | 341/53 |
| 5,793,779 A | * | 8/1998 | Yonemitsu et al. ......... | 371/402 |
| 5,986,592 A | * | 11/1999 | Nakagawa et al. .......... | 341/94 |
| 6,091,347 A | * | 7/2000 | Nakagawa et al. .......... | 341/59 |
| 6,127,951 A | * | 10/2000 | Nicagawa et al. .......... | 341/59 |
| 6,236,341 B1 | * | 5/2001 | Dorward et al. ............. | 341/60 |

* cited by examiner

*Primary Examiner*—Peguy Jeanpierre
*Assistant Examiner*—Joseph Lauture
(74) *Attorney, Agent, or Firm*—Frommer Lawrence & Haug LLP; William S. Frommer; Glenn F. Savit

(57) ABSTRACT

A decoding apparatus and data reproduction apparatus which can perform correction of 1T and 2T which inherently cannot exist as EFM signals, reduce processing of an error correction circuit, and improve the playability. Provision is made of an EPM block containing a correction portion for detecting an edge of an RF signal converted to a binary format by the PLL asymmetry correction circuit for NRZ conversion, using a clock generated in the digital PLL circuit for synchronization, detecting 1T and 2T (T is a channel clock period), which inherently cannot exist as EFM signals in format, generated at the time of synchronization, correcting the detected 1T and 2T signals to 0 or 3T in accordance with predetermined conditions to remove the 1T and 2T from the RF signal, and modulating the RF signal from which the 1T and 2T have been removed by EFM and a demodulation circuit for demodulating by EFM a signal after modulation by EFM.

43 Claims, 13 Drawing Sheets

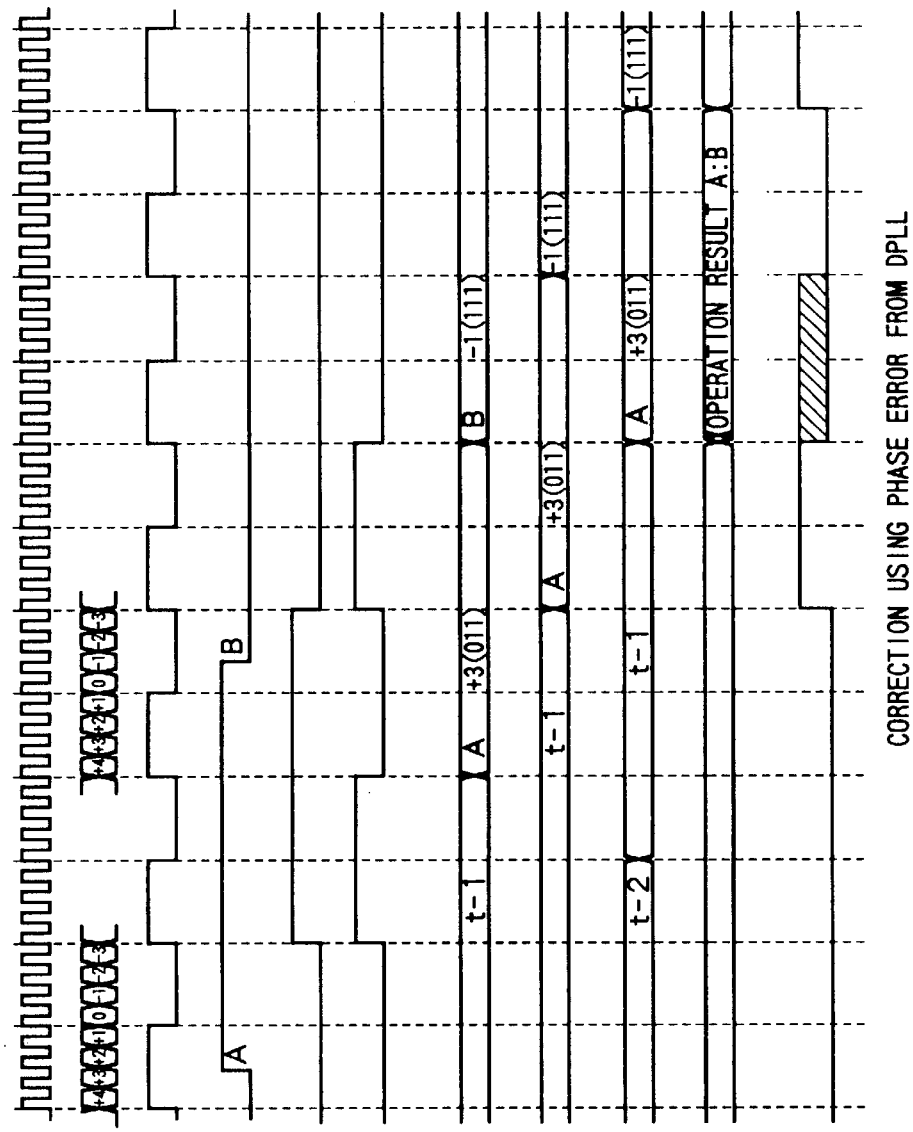

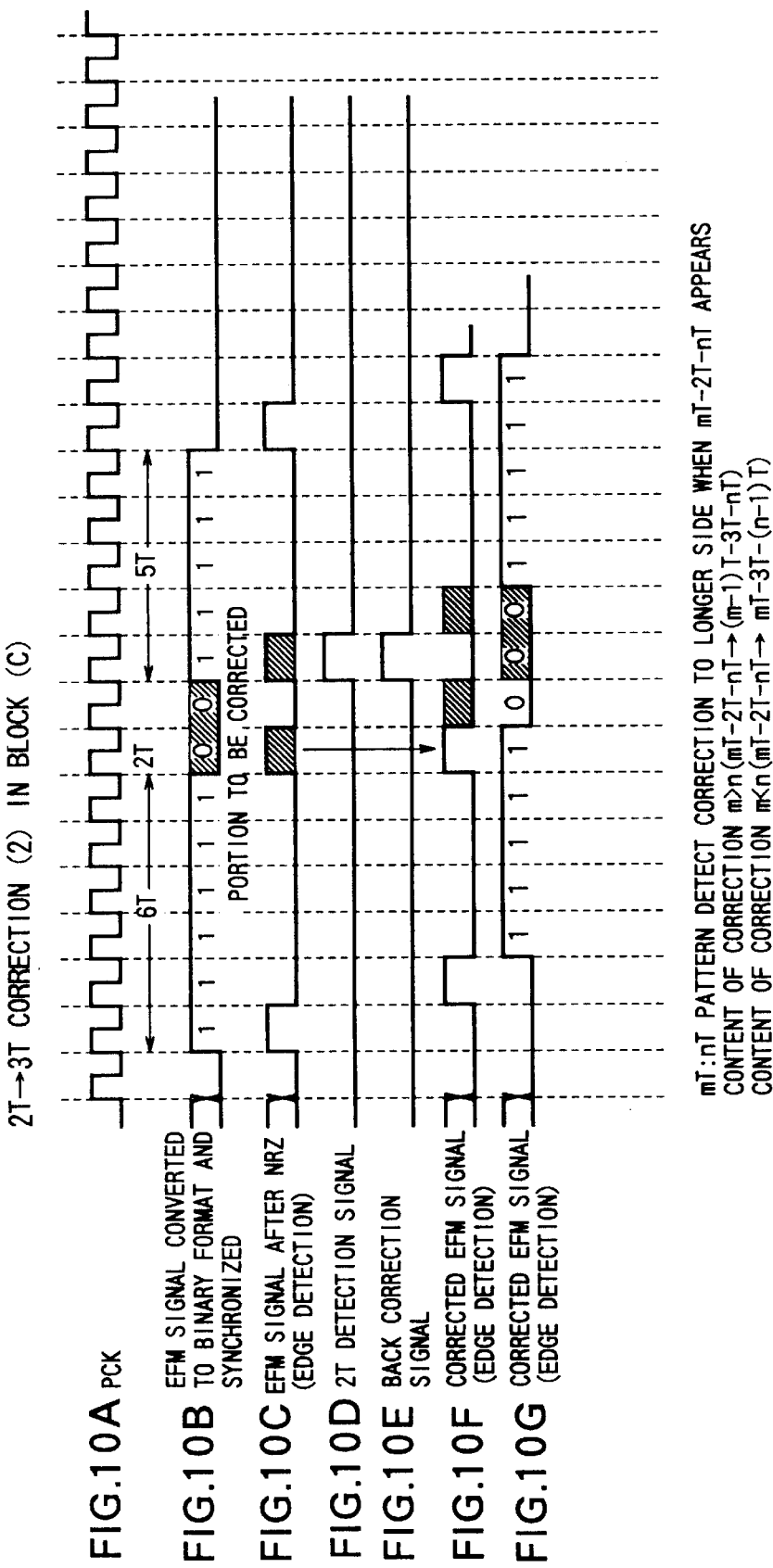

FIG.11

TABLE OF CORRECTION DIRECTION USING PHASE ERROR

○: INDICATION OF CONDITIONS ENABLING SELECTION OF FRONT OR BACK DIRECTION

| FRONT EDGE | BACK EDGE | | | FRONT EDGE | BACK EDGE | |
|---|---|---|---|---|---|---|
| 4 100 | 4 100 | EXTEND BY 1T IN FRONT | | 0 000 | 4 100 | EXTEND BY 1T IN FRONT |
| 4 100 | 3 011 | EXTEND BY 1T IN FRONT | | 0 000 | 3 011 | EXTEND BY 1T IN FRONT |
| 4 100 | 2 010 | EXTEND BY 1T IN FRONT | | 0 000 | 2 010 | EXTEND BY 1T IN FRONT |
| 4 100 | 1 001 | EXTEND BY 1T IN FRONT | | 0 000 | 1 001 | EXTEND BY 1T IN FRONT |
| 4 100 | 0 000 | EXTEND BY 1T IN FRONT | | 0 000 | 0 000 | EXTEND BY 1T IN BACK ○ |
| 4 100 | -1 111 | EXTEND BY 1T IN FRONT | | 0 000 | -1 111 | EXTEND BY 1T IN BACK |
| 4 100 | -2 110 | EXTEND BY 1T IN FRONT | | 0 000 | -2 110 | EXTEND BY 1T IN BACK |
| 4 100 | -3 101 | EXTEND BY 1T IN FRONT | | 0 000 | -3 101 | EXTEND BY 1T IN BACK |

| FRONT EDGE | BACK EDGE | | | FRONT EDGE | BACK EDGE | |
|---|---|---|---|---|---|---|
| 3 011 | 4 100 | EXTEND BY 1T IN FRONT | | -1 111 | 4 100 | EXTEND BY 1T IN FRONT |
| 3 011 | 3 011 | EXTEND BY 1T IN FRONT | | -1 111 | 3 011 | EXTEND BY 1T IN FRONT |
| 3 011 | 2 010 | EXTEND BY 1T IN FRONT | | -1 111 | 2 010 | EXTEND BY 1T IN FRONT |
| 3 011 | 1 001 | EXTEND BY 1T IN FRONT | | -1 111 | 1 001 | EXTEND BY 1T IN BACK ○ |
| 3 011 | 0 000 | EXTEND BY 1T IN FRONT | | -1 111 | 0 000 | EXTEND BY 1T IN BACK |
| 3 011 | -1 111 | EXTEND BY 1T IN FRONT | | -1 111 | -1 111 | EXTEND BY 1T IN BACK |
| 3 011 | -2 110 | EXTEND BY 1T IN FRONT | | -1 111 | -2 110 | EXTEND BY 1T IN BACK |
| 3 011 | -3 101 | EXTEND BY 1T IN BACK ○ | | -1 111 | -3 101 | EXTEND BY 1T IN BACK |

| FRONT EDGE | BACK EDGE | | | FRONT EDGE | BACK EDGE | |
|---|---|---|---|---|---|---|
| 2 010 | 4 100 | EXTEND BY 1T IN FRONT | | -2 110 | 4 100 | EXTEND BY 1T IN FRONT |
| 2 010 | 3 011 | EXTEND BY 1T IN FRONT | | -2 110 | 3 011 | EXTEND BY 1T IN FRONT |
| 2 010 | 2 010 | EXTEND BY 1T IN FRONT | | -2 110 | 2 010 | EXTEND BY 1T IN BACK ○ |
| 2 010 | 1 001 | EXTEND BY 1T IN FRONT | | -2 110 | 1 001 | EXTEND BY 1T IN BACK |
| 2 010 | 0 000 | EXTEND BY 1T IN FRONT | | -2 110 | 0 000 | EXTEND BY 1T IN BACK |
| 2 010 | -1 111 | EXTEND BY 1T IN FRONT | | -2 110 | -1 111 | EXTEND BY 1T IN BACK |
| 2 010 | -2 110 | EXTEND BY 1T IN BACK ○ | | -2 110 | -2 110 | EXTEND BY 1T IN BACK |
| 2 010 | -3 101 | EXTEND BY 1T IN BACK | | -2 110 | -3 101 | EXTEND BY 1T IN BACK |

| FRONT EDGE | BACK EDGE | | | FRONT EDGE | BACK EDGE | |
|---|---|---|---|---|---|---|
| 1 001 | 4 100 | EXTEND BY 1T IN FRONT | | -3 101 | 4 100 | EXTEND BY 1T IN FRONT |
| 1 001 | 3 011 | EXTEND BY 1T IN FRONT | | -3 101 | 3 011 | EXTEND BY 1T IN BACK ○ |
| 1 001 | 2 010 | EXTEND BY 1T IN FRONT | | -3 101 | 2 010 | EXTEND BY 1T IN BACK |
| 1 001 | 1 001 | EXTEND BY 1T IN FRONT | | -3 101 | 1 001 | EXTEND BY 1T IN BACK |
| 1 001 | 0 000 | EXTEND BY 1T IN FRONT | | -3 101 | 0 000 | EXTEND BY 1T IN BACK |
| 1 001 | -1 111 | EXTEND BY 1T IN BACK ○ | | -3 101 | -1 111 | EXTEND BY 1T IN BACK |
| 1 001 | -2 110 | EXTEND BY 1T IN BACK | | -3 101 | -2 110 | EXTEND BY 1T IN BACK |
| 1 001 | -3 101 | EXTEND BY 1T IN BACK | | -3 101 | -3 101 | EXTEND BY 1T IN BACK |

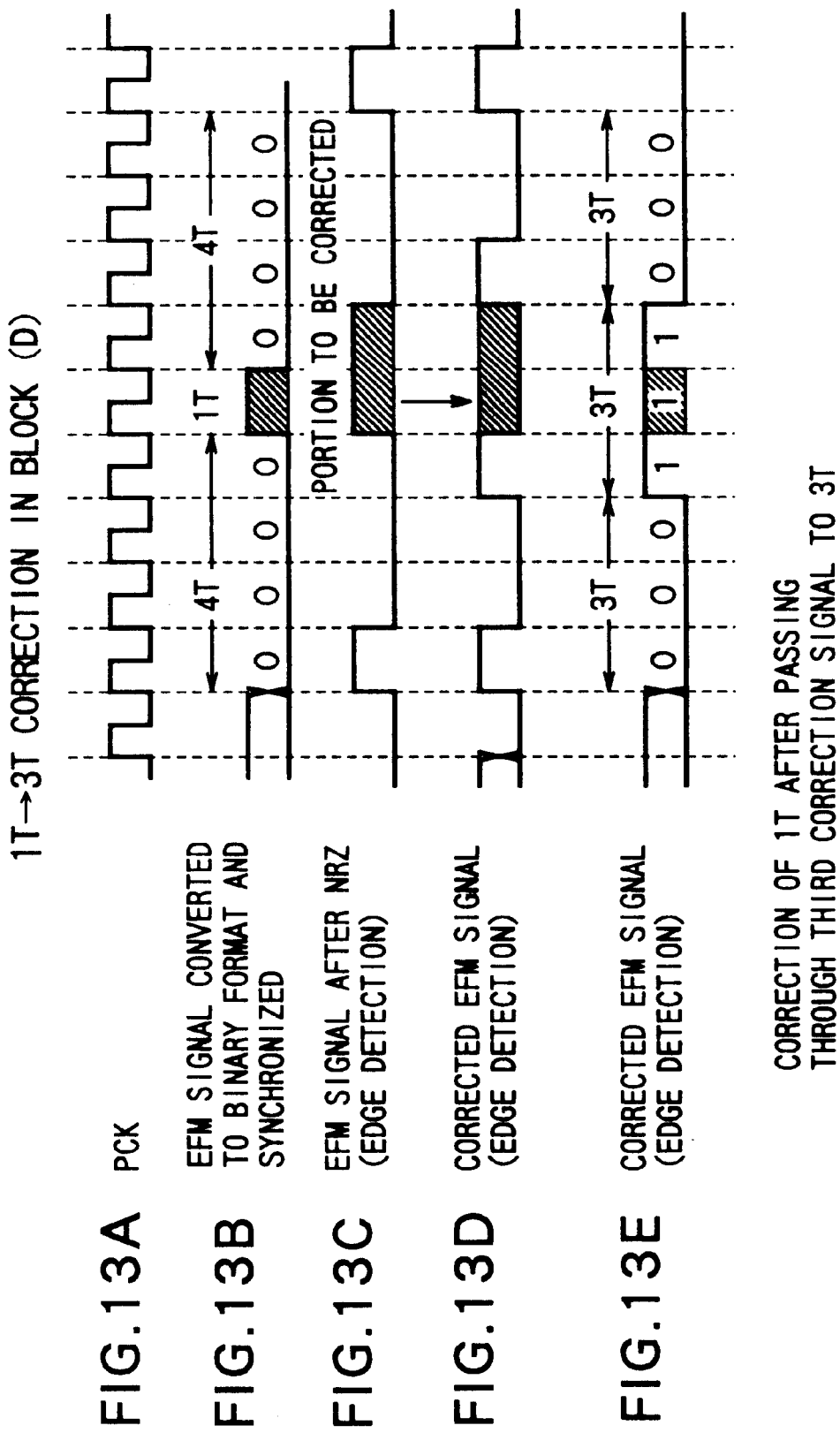

DECODING APPARATUS, DATA REPRODUCTION APPARATUS, AND DECODING METHOD

BACKGROUND OF THE INVENTION

1. Field of the Invention

The present invention relates to a decoding apparatus and data reproduction apparatus for decoding an RF signal read from a digital audio disk called a CD (compact disk) or MD (Mini Disc) or other information storage medium storing information using a RLL (run length limited) code and outputting channel bit data and a method of the same.

2. Description of the Related Art

When transmitting data or, for example, storing data on a magnetic disk, optical disk, magneto optic disk, or other storage medium, the data is modulated so as to make it suitable for the transmission or storage.

A block code is known as one of such modulating codes.

A block code divides a data series into blocks of units comprised of m×i bits and convert the data words into codes comprised of n×i bits in accordance with an appropriate coding rule.

This block code becomes a fixed length code when i=1. When a plurality of i's can be selected, that is, when i is 2 or more and converting by a maximum i of imax=r, it becomes a variable length code.

The block coded code is expressed as a variable length code (d, k;m, n;r).

Here, i indicates a constraint length and r indicates a maximum constraint length. d and k are a minimum consecutive number of "0's" and a maximum consecutive number of "0's" inserted between consecutive "1's" in a code series.

A modulation format of a digital audio disk will be explained as a specific example below.

In a digital audio disk, for example, in a disk of a CD format, a modulation system called EFM (Eight to Fourteen Modulation) is adopted.

Data recorded on a CD is comprised of 16 bits of digital data sampled at 44.1 kHz then divided into two, that is, 8 bits of the upper side and 8 bits of the lower side, subjected to interleaving, and given parity bits along with a C1 and C2 series.

8-bit data words are converted in pattern (EFM modulation) to predetermined 14-bit code words (channel bits), then 3-bit connection bits are added between the data in order to reduce the direct current component after the EFM modulation, and the result is written on the disk by NRZI.

In order to satisfy the conditions that the minimum consecutive number of "0's" inserted between consecutive "1's" in a code series be 2 and the maximum consecutive number of "0's" be 10, 8 bits are converted to 16 bits and connection bits are added.

Accordingly, the parameter (d, k;m, n;r) of this modulation system is (2, 10;8, 17;1).

When the bit interval of a channel bit series (storage waveform series) is T, the minimum inversion interval Tmin becomes 3(=2+1)T. Further, the maximum inversion interval Tmax becomes 11(=10+1)T.

Namely, the data to be converted from 8 bits to 16 bits and given connection bits is finally reduced to a length from 3T to 11T (1/T=4.3218 MHz, one time).

When demodulating this EFM signal, a clock (hereinafter referred to as a playback clock) is generated based on a binary pulse series signal obtained by waveform shaping of an RF signal read from the disk and the playback clock is used for demodulating. When generating the playback clock, a PLL (Phase Locked Loop) circuit is generally used.

The frequency of the playback clock PCK is 4.3218 MHz. This 4.3218 MHz is the channel clock frequency when modulating an EFM signal by PWM by the CD format. The EFM signal is modulated by PWM in one cycle steps from the 3rd cycle to the 11th cycle.

The binary signal obtained by conversion of the RF signal read from the disk to a binary format by waveform shaping is a signal which changes in nT, where T is a cycle of the channel clock (n is an integer from 3 to 11).

In a CD system, however, when an input RF signal is converted to a binary format and demodulated by EFM, the 3T of the EFM signal is sometimes detected as 1T or 2T due to damage or deviation of the comparison level.

In a decoding apparatus of a CD system of the related art, this is not corrected in any way. EFM signals outside 3T to 11T are dealt with as errors as inherently impossible signals and are corrected by an internal error correction circuit.

However, there are limits to the error correction capability of an error correction circuit, so when 1T and 2T are randomly included more than a certain amount, they cannot be corrected by the error correction circuit in the above decoding apparatus of the CD system of the related art and the playability deteriorates.

SUMMARY OF THE INVENTION

The present invention was made in consideration with such a circumstance and has as an object thereof to provide a decoding apparatus and data reproduction apparatus enabling correction of inherently impossible 1T and 2T, enabling reduction of the processing of the error correction circuit, and enabling improvement of the playability and a decoding method for the same.

To achieve the above object, the present invention provides a decoding apparatus for decoding a code which has a consecutive length, the length being a length of symbol arranged consecutively between identical other symbols of a code series formed by two symbols, defined as a predetermined defined length and which has a minimum inversion interval of 3T, where T is a bit interval of a channel bit series, comprising a detecting means for detecting from the code series a pattern of T's which has a minimum inversion interval of smaller than 3T and inherently does not exist in normal cases and a correcting means for correcting any pattern of T's which inherently does not exist detected by the detecting means to signals of a normal format of 3T or more.

Further, the present invention provides a data reproduction apparatus for reproducing code data which has a consecutive length, the length being a length of symbol arranged consecutively between identical other symbols of a code series formed by two symbols, defined as a predetermined defined length and which has a minimum inversion interval of 3T, where T is a bit interval of a channel bit series (storage waveform series) stored on a predetermined storage medium, comprising a means for reproducing an RF signal from the storage medium; a detecting means for detecting from the reproduced RF signal a pattern of T's which has a minimum inversion interval of smaller than 3T and inherently does not exist in normal cases; a correcting means for correcting any pattern of T's which inherently does not exist detected by the detecting means to signals of a normal format of 3T or more; and an error correction circuit for correcting error in the signals corrected by the correcting means.

Further, in the present invention, the detecting means detects a pattern of consecutive T's including 1T and the correcting means removes a 1T portion to correct any detected pattern of consecutive T's including 1T to signals of a normal format of 3T or more.

Alternatively, in the present invention, the detecting means detects a pattern of consecutive T's including 1T and the correcting means corrects an 1T portion of any detected pattern of consecutive T's including 1T to 3T.

Alternatively, in the present invention, the detecting means detects a consecutive pattern including 1T and the correcting means corrects any detected consecutive pattern including 1T to signals of any format of 3T or more.

Alternatively, in the present invention, the detecting means detects a pattern of consecutive T's including 1T and 2T and the correcting means corrects any detected pattern of consecutive T's including 1T and 2T to signals of any format of 3T or more.

Alternatively, in the present invention, the detecting means detects a pattern of consecutive T's including 2T and the correcting means removes the 2T portion to correct any detected pattern of consecutive T's including 2T to signals of a normal format of 3T or more.

Alternatively, in the present invention, the detecting means detects a pattern of consecutive T's including 2T and the correcting means corrects a 2T portion of any detected pattern of consecutive T's including 2T to 3T.

Alternatively, in the present invention, the detecting means detects a consecutive pattern including 2T and the correcting means corrects any detected consecutive pattern including 2T to signals of any format of 3T.

Alternatively, in the present invention, the correcting means compares the lengths of T's in front of and in back of the 2T portion of any detected 2T portion and corrects the 2T to the longer side.

Alternatively, in the present invention, the correcting means compares phase errors of edges of binary signals of 2T, determines in accordance with the comparison results in which direction in front of or in back of the 2T portion to correct the portion, and corrects the 2T to 3T in the determined direction.

Alternatively, in the present invention, the correcting means coercively extends any detected 2T portion by 1T in front of or in back of it to correct it to 3T.

Alternatively, in the present invention, the correcting means coercively extends every detected 2T by 1T alternately in the direction in front of and in back of it.

Alternatively, in the present invention, the correcting means coercively extends any detected 1T by 1T in front of and in back of it to correct it to 3T.

Alternatively, in the present invention, the correcting means comprises a first correction circuit for removing any detected 1T to correct the 1T portion to signals of a normal format of 3T or more; a second correction circuit for correcting any 2T portion detected from output signals of the first correction circuit to 3T; a third correction circuit for comparing phase errors of edges of binary signals of any detected 2T, determining in accordance with the comparison results in which direction in front of or in back of the 2T portion to correct it, and correcting the 2T to 3T in the determined direction; and a fourth correction circuit for correcting any 1T portion detected from output signals of the third correction circuit to 3T.

Alternatively, in the present invention, there is further comprised a means enabling switching of connection of positions of signal lines of the third correction circuit and the fourth correction circuit between an output of the second correction circuit and an output of the correcting means.

Further, the present invention provides a decoding method for decoding a code which has a consecutive length, the length being a length of symbol arranged consecutively between identical other symbols of a code series formed by two symbols, defined as a predetermined defined length and which has a minimum inversion interval of 3T, where T is a bit interval of a channel bit series, comprising detecting from the code series a pattern of T's which has a minimum inversion interval of smaller than 3T and inherently does not exist in normal cases and correcting any detected pattern of T's, which inherently does not exist to signals of a normal format of 3T or more.

According to the present invention, at least one of 1T or 2T, which are patterns of T's where the minimum inversion interval is less than 3T and which inherently does not exist in normal cases, is detected in the detecting means from a code series.

Further, when an inherently impossible pattern of T's is detected by the detecting means, the pattern is corrected in the correcting means to signals of a normal format of 3T or more.

Further, according to the present invention, an RF signal is reproduced from a storage medium.

Then, at least one of 1T or 2T, which are patterns of T where the minimum inversion interval is less than 3T and which inherently does not exist in normal cases, is detected by the detecting means from the reproduced RE signal.

Further, when an inherently impossible pattern of T's is detected by the detecting means, the pattern is corrected in the correcting means to signals of a normal format of 3T or more.

The corrected signal is input to the error correction circuit where the error is corrected.

By correcting the generated 1T and 2T signals in the above way, signals which have been regarded as errors before can be restored. Therefore, the signals to be corrected in the error correction circuit are corrected to a format from 3T to 11T, so the result is that the error rate is improved and the playability is improved.

Furthermore, 1T and 2T signals generated as a result of the amplitude level of the RF signal declining and the RF signal not correctly being input due to fine scratches on the disk surface or signals not precisely converted to a binary format can be removed.

BRIEF DESCRIPTION OF THE DRAWINGS

These and other objects and features of the present invention will become clearer from the following description of the preferred embodiments given with reference to the accompanying drawings, in which:

FIG. 9 is a timing chart of correction using phase error from the digital PLL circuit in FIG. 8;

FIG. 10 is a timing chart at correction by comparing lengths of T's in front and in back in FIG. 8;

FIG. 11 is a view of conditions for determining the direction of correction by phase error;

FIG. 13 is a timing chart for explaining the operation of FIG. 12.

DESCRIPTION OF THE PREFERRED EMBODIMENTS

Embodiment of the present invention as applied to, for example, a CD player will be explained in detail below with reference to the drawings. Note that the present invention is not limited to application to a CD layer and may be applied to an MD player and the rest of the entire range of disk players.

Figure 1:
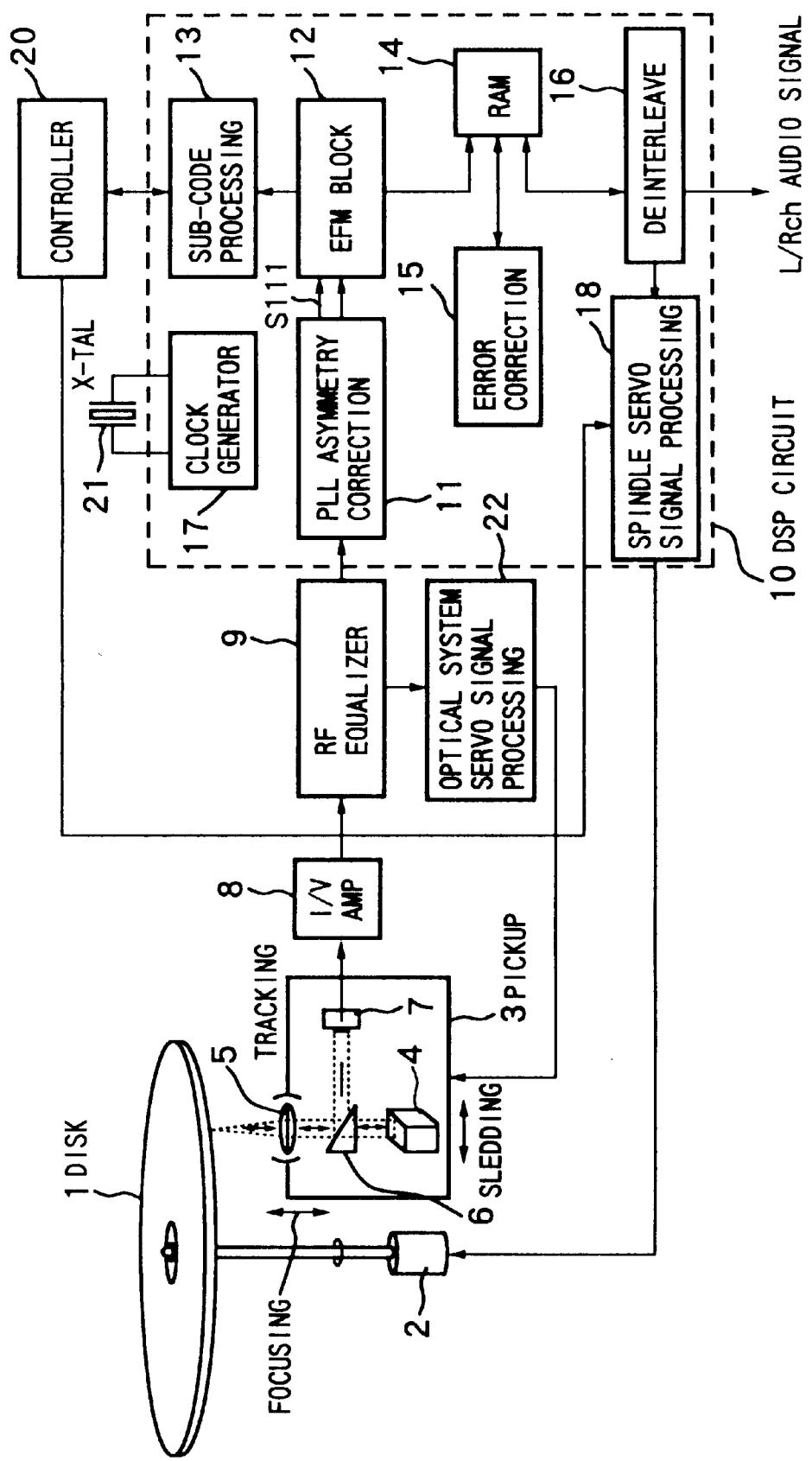
FIG. 1 is a view of the configuration of an embodiment of a control system of a CD player to which a decoding apparatus according to the present invention is applied.

FIG. 1 is a view of the configuration of an embodiment of a control system of a CD player to which a decoding apparatus according to the present invention is applied.

The present control system comprises as main components, as shown in FIG. 1, a disk 1 (CD; an information disk using code modulation), a spindle motor 2, an optical pickup (hereinafter simply referred to as a pickup), an I/V amplifier 8, an RF equalizer 9, a DSP (digital signal processor) 10, a controller 20, and an optical system servo signal processing circuit 22.

In FIG. 1, the disk 1, that is, an information disk using code modulation, is driven to rotate by the spindle motor 2. The stored information on the disk 1 is read by the optical pickup 3.

The pickup 3 is comprised of a laser diode 4, an object lens 5 for focusing a laser beam emitted from the laser diode 4 as an information reading laser spot on the signal recording surface of the disk 1, a polarization beam splitter 6 for changing a direction of advance of a reflected beam from the disk 1, a photo detector 7 for receiving the reflected beam, etc. and is provided to be movable in the radial direction of the disk using a sled-feed motor (not shown) as a drive.

Furthermore, although not shown, the pickup 3 has built in it a tracking actuator for moving the information reading laser spot in the disk radial direction with respect to recording tracks on the disk 1 and a focus actuator for moving the object lens 5 in the direction of its optical axis.

An output signal of the pickup 3 is converted from a current signal to a voltage signal in the I(current)/V(voltage) amplifier 8, is further shaped in waveform in the RF equalizing circuit 9, then is supplied to the DSP (digital signal processor) circuit 10 as an RF signal.

The DSP circuit 10 comprises a PLL asymmetry correction circuit 11, an EFM block 12, a sub code processing signal 13, a RAM 14, an error correction circuit 15, a deinterleave circuit 16, and a clock generator 17. This signal processing system will be explained later on.

The DSP circuit 10 is further provided with a spindle servo signal processing circuit 18 for the control of the rotation the spindle motor 2. The DSP circuit 10 has built in it a clock generator 17 for generating a variety of clocks based on a highly accurate oscillation output of a crystal oscillator 21 and performs a variety of signal processing based on each clock.

Note that the optical system servo signal processing circuit 22 is for controlling the servo systems relating the operation of the pickup 3, that is, a tracking servo system for making the information reading laser spot track the recording tracks on the disk 1, a focus servo system for focusing the laser spot on the signal recording surface of the disk 1, and a sled servo system for controlling the position of the pickup 3 in the disk radial direction.

Next, a signal processing system of the DSP circuit 10 will be explained.

The PLL asymmetry correction circuit 11 receives an RF signal from the RF equalizer 9, corrects asymmetry, and outputs a binary RF signal (EFM signal) to the EFM block 12.

Note that the "asymmetry" means a state where the center of the eye pattern of the RF signal deviates from the center of the amplitude.

Further, the PLL asymmetry correction circuit 11 has built in it a digital PLL circuit 111 for generating a playback clock PCK based on a binary signal edge (binary pulse series signal).

The frequency of the playback clock PCK is 4.3218 MHz.

The digital PLL circuit 111 generates a reference clock HIF comprised of a whole multiple of the playback clock PCK based on the binary EFM signal, uses the reference clock HIF to detect a phase error amount when synchronizing the EPM signal and playback clock PCK, and supplies the phase error of the RF signal as 3-bit phase error information S111 to a correction portion 121 of the EFM block 12 as will be explained laser on.

Note that the reference clock HIF of the whole multiple of the playback clock PCK is 4.3218 MHz×8(=34.5744 MHz) at the time of normal speed operation, while is 4.3218 MHz×6 (=25.9308 MHz) at the time of double-speed operation.

The relationship between the phase error obtained from the digital PLL circuit 111 and the values is shown below. Note that the parenthesized values are 3-bit data output from the digital PLL circuit 111.

| Normal speed operation | | Double-speed operation |
|---|---|---|
| Phase advance | +4(100) | |
| Phase advance | +3(011) | +3(101) |
| Phase advance | +2(010) | +1(001) |
| Phase advance | +1(001) | +1(001) |
| No phase difference | 0(000) | 0(000) |
| Phase delay | −1(111) | −1(111) |
| Phase delay | −2(110) | −2(110) |
| Phase delay | −3(101) | |

Figure 2:
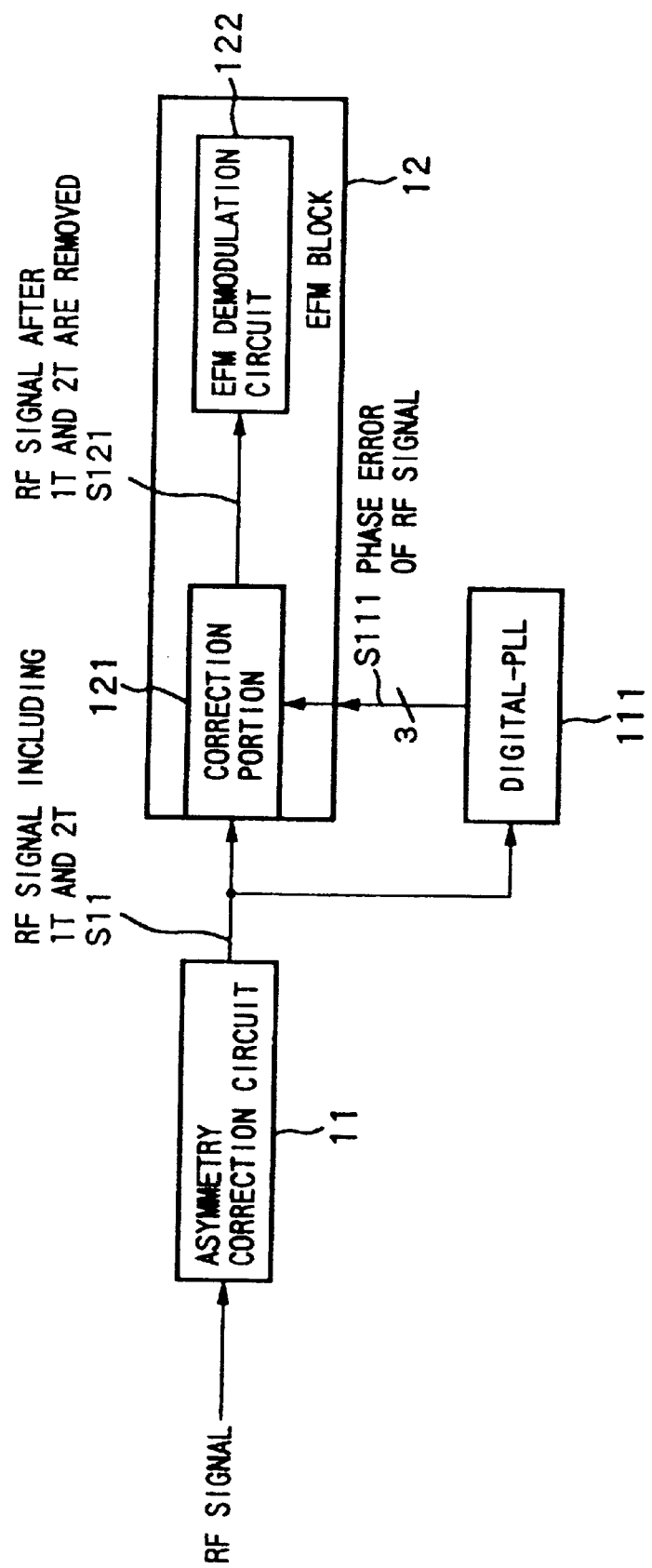
FIG. 2 is a block diagram of the configuration of an EFM block according to the present invention.

The EFM block 12, as shown in FIG. 2, comprises a correction portion 121 for detecting an edge of an RF signal converted to a binary format by the PLL asymmetry correction circuit 11 for NRZ conversion, using a clock generated in the digital PLL circuit 111 for synchronization, detecting 1T and 2T (T is a channel clock period), which inherently cannot exist as EFM signals in format, generated at the time of synchronization, correcting (the correction will be explained in detail later on) the detected 1T and 2T signals to 0 or 3T in accordance with predetermined conditions to remove the 1T and 2T from the RF signal, and modulating the RF signal from which the 1T and 2T have been removed by EFM and a demodulating circuit 122 for demodulating by EPM a signal after modulation by EFM.

The EFM signal demodulated in the EFM block 12 becomes digital audio data and error correction and detection parity bits. A sub-code immediately following a frame synchronization signal is demodulated. The sub-code is supplied to a controller 20 via a sub-code processing circuit 13.

The data after the demodulation by EFM is temporarily stored in a RAM 14 and corrected for error in the error correction circuit 15 based on the error correction and detection parity bits.

The data after the error correction is deinterleaved from the CIRC (cross interleave Reed-Solomon code) in the de-interleave circuit 16 and output as an audio signal of L/R ch.

The operation and configuration of the correction portion 121 in the EFM block 12, which is a characterizing feature of the present invention, will be explained below in order.

The correction portion 121 corrects 1T and 2T signals included in the EFM signals, which inherently cannot exist and had become regarded as errors in format due to fine scratches on the surface of the CD, MD, DVD, or other information disk using a code modulation or for example deviation of the comparison level in the RF equalizer 9, to 0 or 3T, for example, in accordance with the modes shown below.

The correction modes include a pattern detection mode, an edge detection mode, and a coercive correction mode. These correction modes explained correct 1T or 2T signals to 0 or 3T signals as explained below.

1. Pattern Detection Mode

Detects a pattern of consecutive T's including 1T and corrects It t o 0 or 3T.

Detects a consecutive pattern including 1T and corrects it to any T's.

Detects a consecutive pattern including 1T and 2T and corrects it to any T's.

Detects a pattern of consecutive T's including 2T and corrects it to 0 or 3T.

Detects a consecutive pattern including 2T and corrects it to any T's.

2. Edge Comparison Mode

When 2T is detected, compares lengths of T's in front of and in back of it and corrects to the longer length.

Compares the phase errors of the edges of the EFM signal of 2T and corrects it to 3T.

3. Coercive Correction Mode

When 2T is detected, coercively extends it by 1T in front of or in back of it to correct it to 3T.

When 1T is detected, coercively extends it by 1T in front of and in back of it to correct it to 3T.

Figure 3:
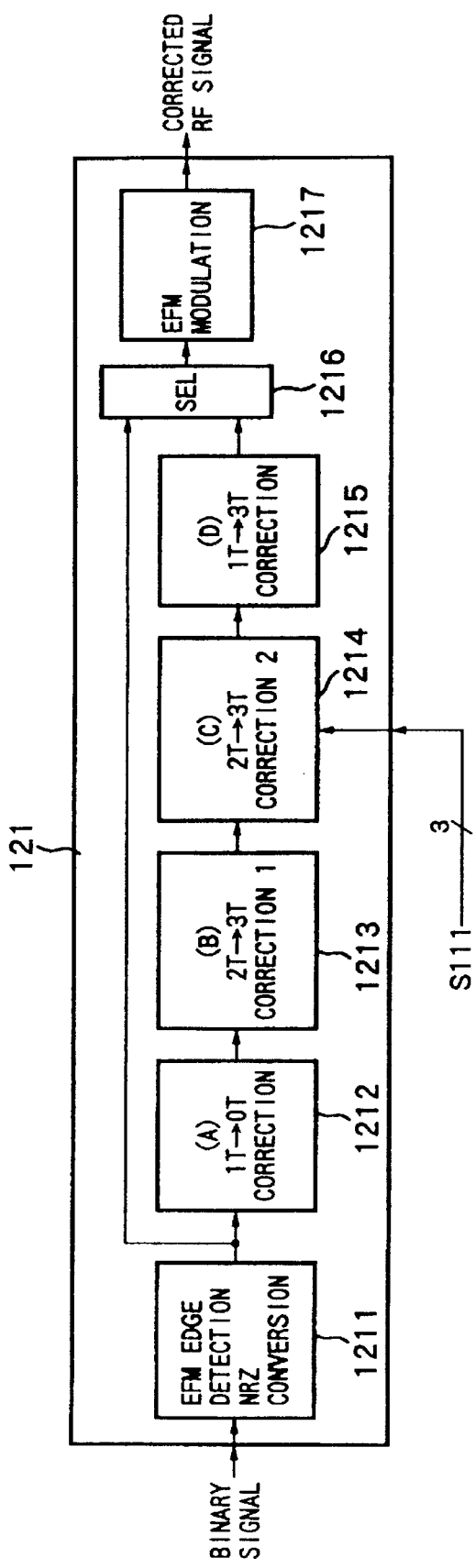
FIG. 3 is a block diagram of an example of the configuration of a correction circuit of the EPM block according to the present invention.

The correction portion 121 is, as shown in FIG. 3, comprised of an NRZ conversion/edge detection circuit 1211, a first correction circuit 1212 for correcting a detected 1T to 0T, a second correction circuit 1213 for correcting a detected 2T to 3T or 0T, a third correction circuit 1214 for correcting a detected 2T to 3T, a fourth correction circuit 1215 for correcting a detected 1T to 3T, a selector 1216, and an EFM modulation circuit 1217.

Note that the selector 1216 inputs an output of the fourth correction circuit 1215 to the EFM modulation circuit 1217 during the correction mode, while directly inputs an output signal of the NRZ conversion/edge detection circuit 1211 to the EFM modulation circuit 1217 when the correction is not carried out.

In the correction portion 121 having the above configuration, the RF signal (EFM signal) converted to a binary format in the asymmetry correction circuit is converted by NRZ and edge detected in the NRZ conversion/edge detection circuit 1211, then corrected in the first correction circuit 1212(A)→the second correction circuit 1213(B)→the third correction circuit 1214(C)→the fourth correction circuit 1215(D), converted to an EFM signal again in the EPM modulation circuit 1217, and sent to a later EFM demodulation circuit 122.

In the correction portion 121, correction is performed taking note of any pattern including 1T in consecutive T's. In this case, patterns which have a low frequency of occurrence and patterns where lengths of T's including 1T and 2T in front of and in back of it are input along with a certain pattern are reliably corrected. After the correction, the most effective correction is performed.

By correcting from a short signal of 1T to a longer one, the correction can be effectively performed.

Also, by correcting only 1T and 2T signals, it is possible to perform the correction without destroying the 3T to 11T of correctly input EFM signals.

Next, the specific circuit configurations of the first to fourth correction circuits will be explained with reference to the drawings.

Figure 4:
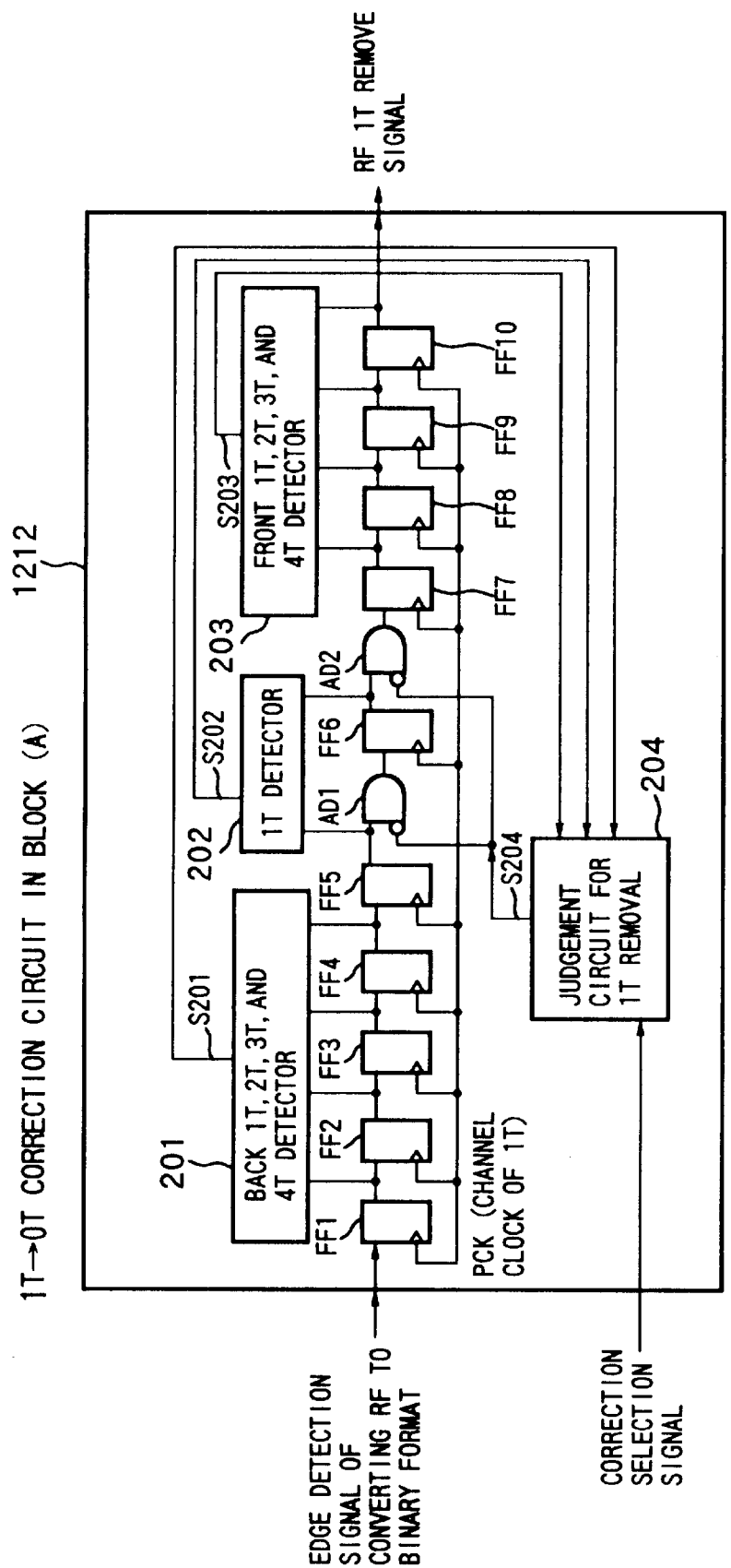
FIG. 4 is a circuit diagram of an example of the configuration of a first correction circuit in FIG. 3.
Figure 5:
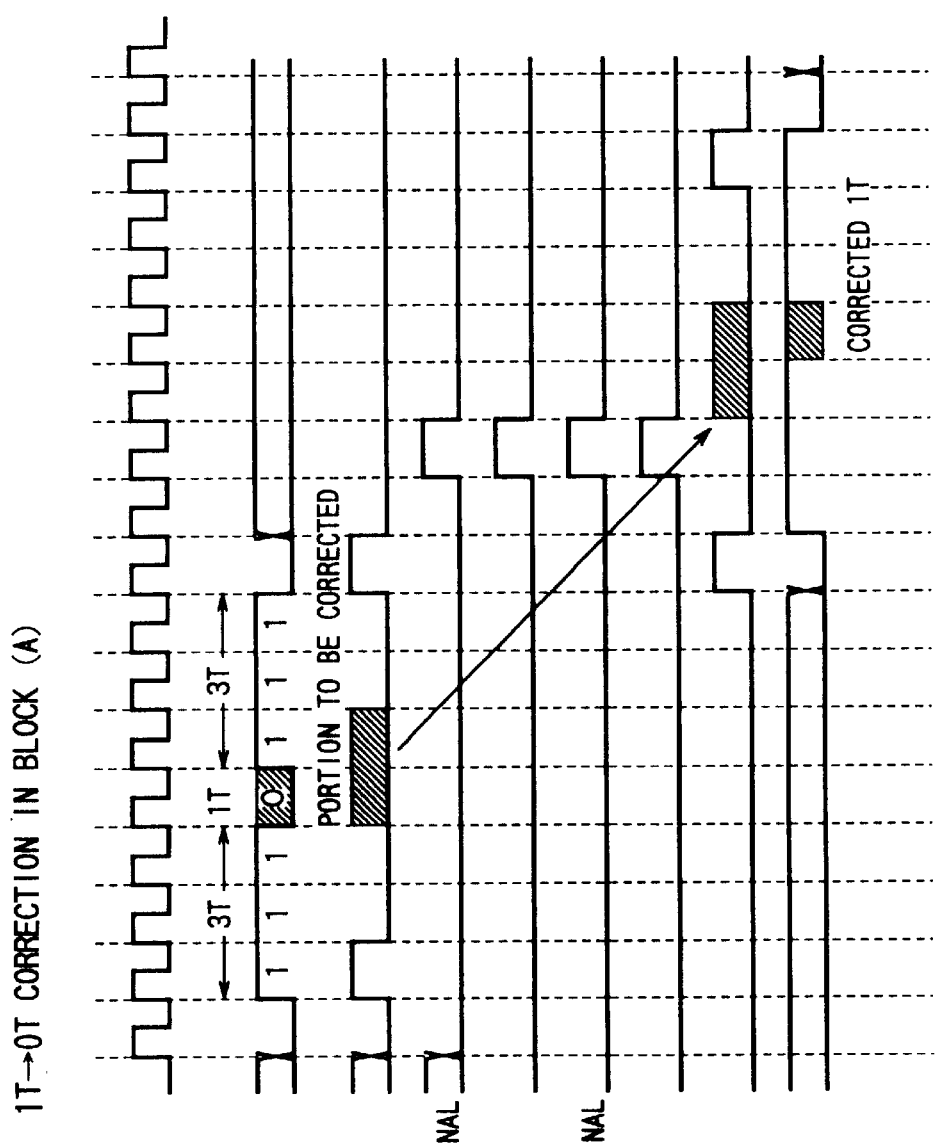
FIG. 5 is a timing chart for explaining the operation of FIG. 4.

FIG. 4 is a circuit diagram of an example of the configuration of the first correction circuit 1212, while FIG. 5 is a timing chart of FIG. 4.

Note that an example of correcting a consecutive pattern 3T-1T-3T including 1T will be explained here.

The first correction circuit 1212 comprises, as shown in FIG. 4, D-type flip-flops FF1 to FF10, 2-input AND gates AD1 and AD2, a back 1T, 2T, 3T, and 4T detector 201, a 1T detector 202, a front 1T, 2T, 3T, and 4T detector 203, and a judgement circuit 204.

A playback clock (a channel clock of 1T) PCK generated in the digital PLL circuit 111 of the PLL asymmetry circuit 11 is supplied to clock CK terminals of the flip-flops FF1 to FF10.

Then, Q-outputs and D-inputs of the flip-flops FF1 to FF5 are connected in cascade, a signal S1211 edge-detected in the NRZ conversion/edge detection circuit 1211 is input to the D-input of the flip-flop FF1, while Q-outputs of the flip-flops FF1 to FF4 are input to the detector 201. A Q-output of the flip-flop FF5 is connected to one input terminal of the AND gate AD1.

The other input terminal (negative input terminal) of the AND gate AD1 is connected to an output line of the 1T correction signal S204 of the judgement circuit 204, while an output terminal is connected to a D-input of the flip-flop FF6. A Q-output of the flip-flop FF6 is connected to one input terminal of the AND gate AD2.

The other input terminal (negative input terminal) of the AND gate AD2 is connected to an output line of a 1T correction signal S204, while an output terminal is connected to a D-input of the flip-flop FF7.

Furthermore, Q-outputs and D-inputs of the flip-flops FF7 to FF10 are connected in cascade, Q-outputs of the flip-flops FF1 to FF4 are input to the detector 203, and the Q-output of the flip-flop FF10 is output as a corrected signal to a next second correction circuit 1213.

The detector 201 detects a back 1T, 2T, 3T, or 4T from the Q-outputs of the flip-flops FF1 to FF4 and outputs the detection result as a signal S201 to the judgement circuit 204. For example, when 1T, 2T, 3T, or 4T is detected, a signal S201 of for example a high level is output to the judgement circuit 204.

The 1T detector 202 detects a back 1T from the Q-outputs of the flip-flops FF1 to FF4 and outputs the detection result as a signal S201 to the judgement circuit 204. When 1T is detected, a signal S202 of for example a high level is output to the judgement circuit 204.

The detector 203 detects a front 1T, 2T, 3T, or 4T from the Q-outputs of the flip-flops FF7 to FF10 and outputs the detection result as a signal S203 to the judgement circuit 204. For example, when 1T, 2T, 3T, or 4T is detected, a signal S203 of for example a high level is output.

When the judgement circuit 204 receives as input the detection signals S201, S202, S203 from the detectors 201, 202, and 203 all at high levels, it judges that 1T should be removed from the consecutive signal pattern and outputs a 1T correction signal S204 to the other input terminals (negative input terminals) of the AND gates AD1 and AD2.

Here, the correction operation of the first correction circuit 1212 having the above configuration will be explained using an example of correcting a consecutive pattern 3T-1T-3T including 1T.

An EFM signal converted to a binary format and then synchronized as shown in FIG. 5B is converted by NRZ and then edge-detected in the NRZ conversion/edge detection circuit 1211 to give the signal shown in FIG. 5C.

Then, the signal after the edge detection is input to the first correction circuit 1212 where it is shifted by the clock period of the playback clock PCK from a register for detecting T's in back of the 1T.

When a 1T to be corrected is detected by the detector 202, specifically, when outputs of the flip-flops FF6 and FF5 become logic "1, 1", 3T is detected in the back detector 201 at the timing where an output signal S202 of the detector 202 becomes a high level, the output signal S201 of the detector 201 is set at a high level as shown in FIG. 5D, 3T is detected in the front detector 203, and an output signal S203 of the detector 203 is set at a high level as shown in FIG. 5F, the judgement circuit 204 judges that 1T should be removed and the correction signal S204 is set at a high level as shown in FIG. 5E and output.

As a result, as shown in FIG. 5H, the 1T portion is removed from the edge-detected signal.

The corrected EFM signal obtained by modulation of the signal from which the 1T portion has removed at the latter EFM modulation circuit 1217 becomes a 7T signal as shown in FIG. 5I.

Namely, the EPH signal of the consecutive pattern 3T-1T-3T including 1T is corrected to a 7T signal by removing the 1T by the first correction circuit 1212.

The first correction circuit 1212 uses the above operation to perform the same correction when the pattern matches the following patterns including 1T:

Correction by Detecting Typical Consecutive Appearance of 1T (1) Content of correction (2T-1T-2T→5T)
(2) Content of correction (3T-1T-3T→7T)
(3) Content of correction (4T-1T-3T→8T)
(4) Content of correction (3T-1T-4T→8T)

Deletion of Consecutive 1T's
(5) Content of correction (1T-1T-1T→3T)
(6) Content of correction (2T-1T-1T→4T)
(7) Content of correction (1T-1T-2T→4T)

Also, a correction selection signal may be given to the judgement circuit 204 for these corrections to select any content of correction.

Next, the configuration and function of the second correction circuit 1213 will be explained.

Figure 6:
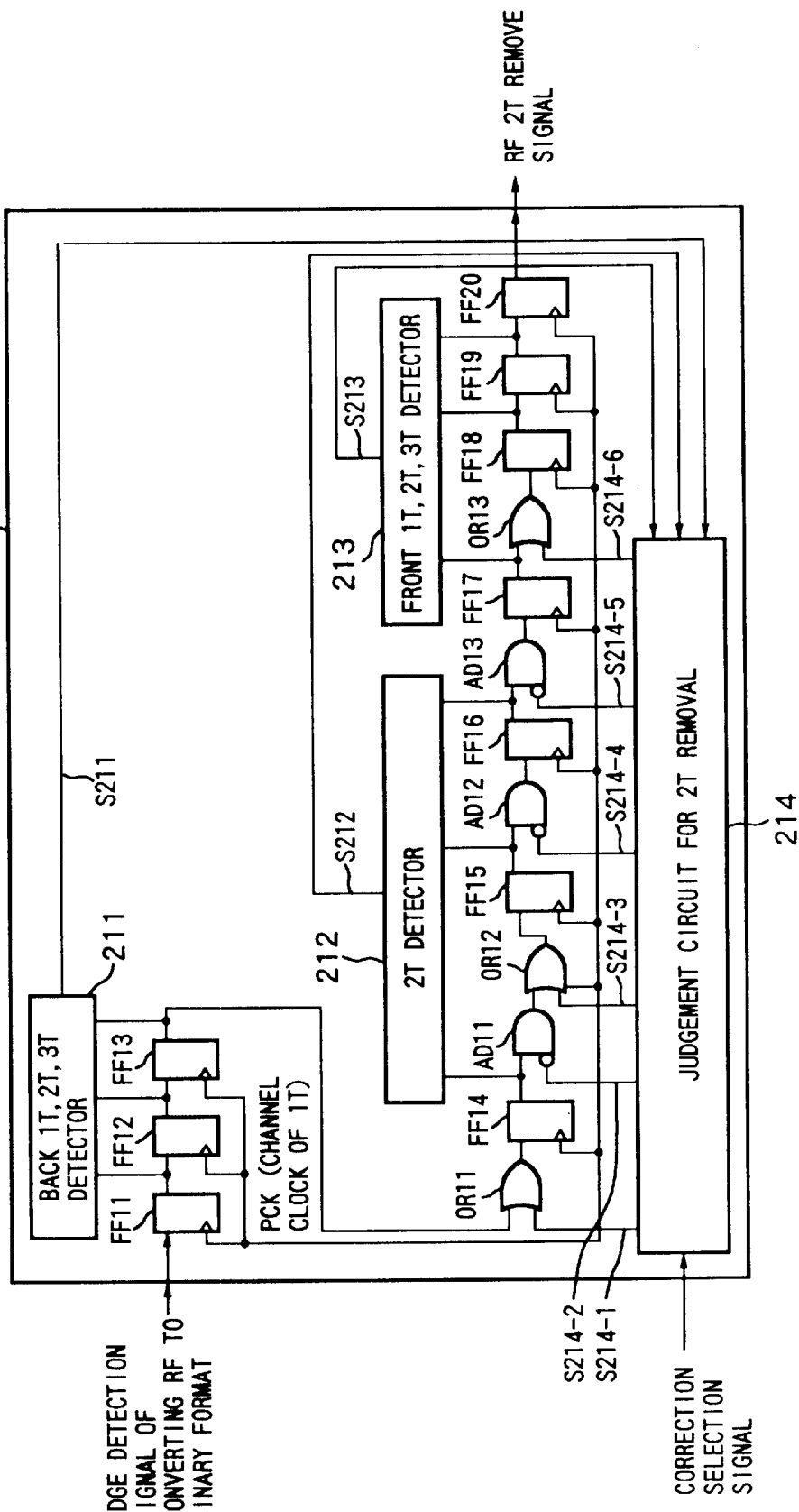
FIG. 6 is a circuit diagram of an example of the configuration of a second correction circuit in FIG. 3.
Figure 7:
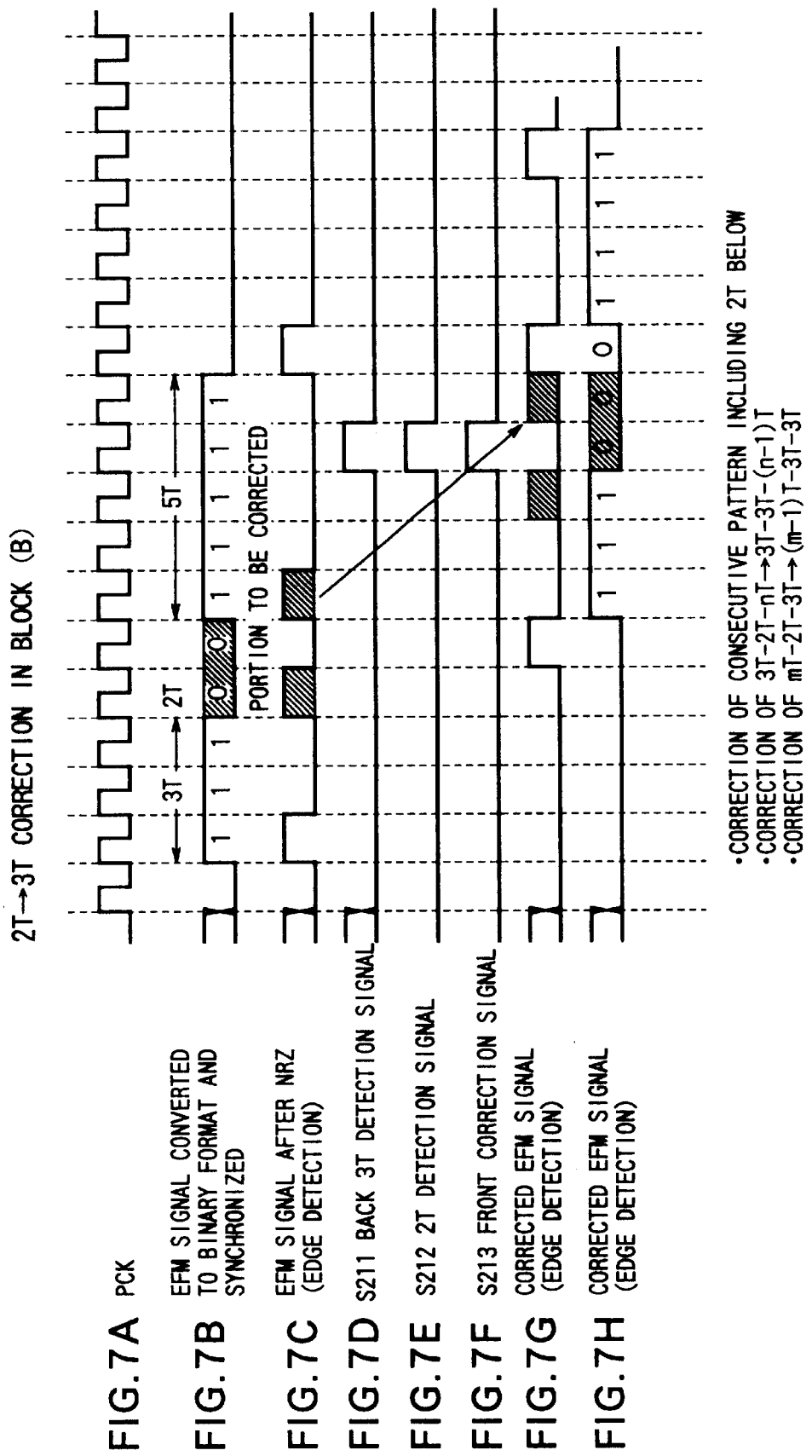
FIG. 7 is a timing chart for explaining the operation of FIG. 6.

FIG. 6 is a circuit diagram of an example of the configuration of the second correction circuit 1213, and FIG. 7 is a timing chart of FIG. 6.

In the circuit, when 2T including 3T in front of or in back of it is detected from an output signal of the first correction circuit 1212, correction is performed without destroying the 3T existing in front of or in back of it.

Note that FIG. 7B shows the EFM signal before the edge detection, while FIG. 7C shows the signal after the edge detection.

The second correction circuit 1213 comprises, as shown in FIG. 6, D-type flip-flops FF11 to FF20, 2-input AND gates AD11 to AD13, 2-input OR gates OR11 to OR13, a back 1T, 2T, and 3T detector 211, a 2T detector 212, a front 1T, 2T, and 3T detector 213, and a 2T removal judgement circuit 214.

A playback clock (channel clock of 1T) PCK generated in the digital PLL circuit 111 of the PLL asymmetry circuit 11 is supplied to a clock CK terminal of the flip-flops FF11 to FF20.

Then Q-outputs and D-inputs of the flip-flops FF11 to FF13 are connected in cascade, a signal S1211 edge-detected in the NRZ conversion/edge detection circuit 1211 is input to the D-input of the flip-flop FF11, while Q-outputs of the flip-flops FF11 to FF13 are input to the detector 211. A Q-output of the flip-flop FF13 is connected to one input terminal of the OR gate OR11.

The other input terminal of the OR gate OR11 is connected to an output line of the correction signal S214-1 of the judgement circuit 214, while an output terminal is connected to a D-input of the flip-flop FF14. A Q-output of the flip-flop FF14 is connected to one input terminal of the AND gate AD11.

The other input terminal (negative input terminal) of the AND gate AD11 is connected to an output line of a correction signal S214-2 of the judgement circuit 214, while an output terminal is connected to one input terminal of the OR gate OR12.

The other input terminal of the OR gate OR12 is connected to an output line of the correction signal S214-3 of the judgement circuit 214, while an output terminal is connected to a D-input of the flip-flop PF15. A Q-output of the flip-flop FF15 is connected to one input terminal of the AND gate AD12.

The other input terminal (negative input terminal) of the AND gate AD12 is connected to an output line of a correction signal S214-4 of the judgement circuit 214, while an output terminal is connected to a D-input of the flip-flop FF16. The Q-output of the flip-flop FF16 is connected to one input terminal of the AND gate AD13.

The other input terminal (negative input terminal) of the AND gate AD13 is connected to an output line of a correction signal S214-5 of the judgement circuit 214, while an output terminal is connected to a D-input of the flip-flop FF17. The Q-output of the flip-flop FF17 is connected to one input terminal of the OR gate OR13.

The other input terminal of the OR gate OR13 is connected to an output line of the correction signal S214-6 of the judgement circuit 214, while an output terminal is connected to a D-input of the flip-flop FF18.

The Q-outputs of the flip-flops FF14, FF15, and PF16 are input to the detector 212.

Furthermore, Q-outputs and D-inputs of the flip-flops FF18 to FF20 are connected in cascade, the Q-outputs of the flip-flops FF18 to FF20 are input to the detector 213, and the Q-output of the flip-flop FF20 is output as a corrected signal to the next third correction circuit 1214.

The detector 211 detects a back 1T, 2T, or 3T from the Q-outputs of the flip-flops FF11 to FF13 and outputs the detection result as a signal S211 to the judgement circuit 214. For example, when 1T, 2T, or 3T is detected, a signal S211 of for example a high level is output to the judgement circuit 214.

The 2T detector 212 outputs a signal S212 of for example a high level to the judgement circuit 214 when 2T is detected from the Q-outputs of the flip-flops PF14, FF15, and FF16.

The detector 213 detects a front 1T, 2T, or 3T from the Q-outputs of the flip-flops FF18, FF19, and FF20 and outputs the detection result as a signal S213 to the judgement circuit 214. For example, when 1T, 2T, or 3T is detected, a signal S213 of for example a high level is output.

When the judgement circuit 214 receives for example as input the detection signals S212 and S213 from the detectors 212 and 213 at a high level, it judges that 2T should be removed from the consecutive signal pattern and outputs correction signals S214-1 to S214-6 at a predetermined level in order to correct the front side.

More specifically, when 2T to be corrected is detected in the detector 212, the 2T correction signal becomes valid if a back 3T is detected. The judgement circuit 214 determines the direction of correction of the 2T to 3T based on the detected signals and outputs correction signals S214-1 to S214-6 in accordance with the decision.

Next, the correction operation of the second correction circuit 1213 having the above configuration will be explained using as an example correction of a consecutive pattern 3T(front)-2T-5T(back) including 2T.

The signal passing through the first correction circuit 1212 is input to the second correction circuit 1213 shifted by a clock period of the playback clock PCK from the register for detecting 3T behind 2T.

When the detector 212 detects 2T to be corrected and the detection signal S212 is set at a high level as shown in FIG. 7E, a front 3T is detected at the detector 213. If the detection signal S213 is set at a high level as shown in FIG. 7F, the 2T correction signal becomes valid (FIG. 7F).

Then, the direction of correction of the 2T to 3T is determined in the judgement circuit 214 based on the detected signals, and correction signals S214-1 to S214-6 in accordance with the determination are output.

The 2T is corrected by the decision signal. In the example in FIG. 7, the decision is made to correct to the back side and correction for making the back 5T to 4T is performed.

In this case, correction signals S214-1, S214-2. and S214-4 are output at a high level and correction signals S214-3, S214-5, and S214-6 are output at a low level.

As a result, as shown in FIG. 7G, the 2T portion is corrected to 3T in the signal after edge detection.

The corrected EFM signal obtained by modulation in the later EFM modulation circuit 1217 becomes the signal as shown in FIG. 7H.

Namely, the EFM signal of the consecutive pattern 3T-2T-5T including 2T is corrected to 3T-3T-4T by the second correction circuit 1213.

In the above explanation, a case of back correction was explained. In the case of front correction for example, the correction signals S214-3, S214-4, S214-5 and S214-6 output from the judgement circuit 214 are set at a high level and the signals S214-1 and S214-2 are set at a low level.

Also, when removing 2T, correction signals S214-2 and S214-5 output from the judgement circuit 214 are set at a high level and the signals S214-1, S214-3, S214-4, and S214-6 are set at a low level.

Also, the second correction circuit 1213 performs correction in the same way a pattern matches with the following patterns including 2T.

When a 2T covered is bracketed by 1T and 2T in the corrections of the following (1) to (3), the 1T and 2T in the front and back are detected so as not to damage portions other than the T's concerned due to mistaken correction.

Correction of Typical 2T Patterns
(1) Content of correction (3T-2T-nT→3T-3T-(n−1)T), where n>4
(2) Content of correction (nT-2T-3T→(n−1)T-3T-3T)
Correction to 8T when 3T Appears at Two Sides of 2T
(1) Content of correction (3T-2T-3T→8T)

Also, the judgement circuit 214 of the second correction circuit 1213 can freely select the correction content in the same way as in the judgement circuit 204 in the first correction circuit 1212 by giving a correction selection signal for these corrections.

Next, the configuration and the function of the third correction circuit will be explained.

Figure 8:
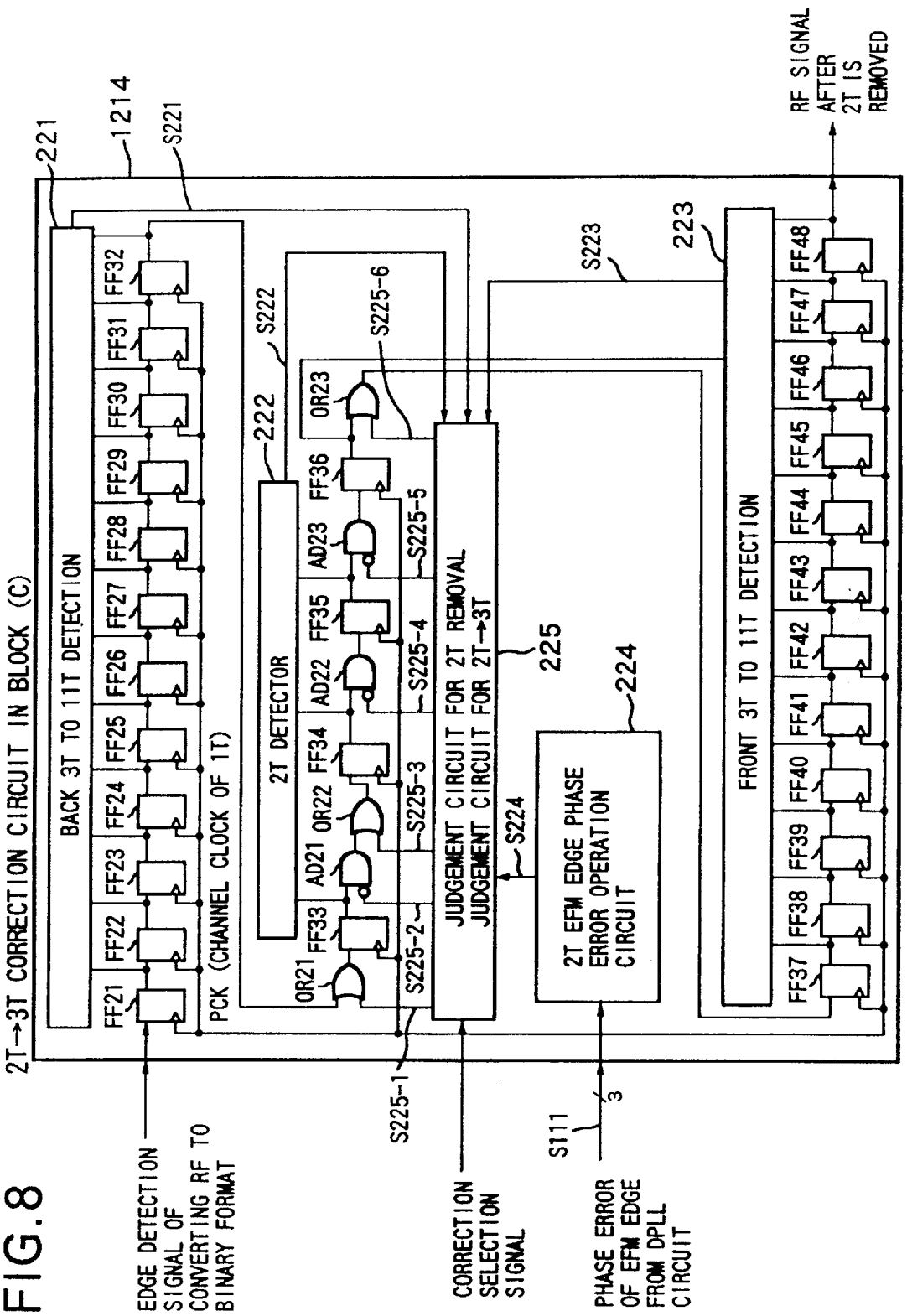
FIG. 8 is a circuit diagram of an example of the configuration of a third correction circuit in FIG. 3.

FIG. 8 is a circuit diagram of an example of the configuration of the third correction circuit 1214, and FIG. 9 and FIG. 10 are timing charts of FIG. 8.

This circuit can be used switched among three main ways of correction.

The three ways are, first, correction by using a phase error from the digital PLL circuit 11, second, correction by comparing lengths of T's in front or in back, and, third, coercive correction to 3T when 2T appears.

Note that FIG. 9 is a timing chart of correction by using a phase error from the digital PLL circuit 11, and FIG. 10 is a timing chart of correction by comparing lengths of T's in front or in back.

The third correction circuit 1214 comprises, as shown in FIG. 8, D-type flip-flops FF21 to FF48, 2-input AND gate AD21 to AD23, 2-input OR gates OR21 to OR23, a back 3T to 11T detector 221, a 2T detector 222, a front 3T to 11T detector 223, a phase error operation circuit 224 for an EFM edge of 2T, and a 2T removal/2T→3T judgement circuit 225.

A playback clock (a channel clock of 1T) PCK generated in the digital PLL circuit 111 of the PLL asymmetry circuit 11 is supplied to clock CK terminals of the flip-flops FF21 to FF48.

Then, Q-outputs and D-inputs of the flip-flops FF21 to FF32 are connected in cascade, a signal S1211 (an output signal of the second correction circuit 1213) edge-detected at the NRZ conversion/edge detection circuit 1211 is input to the D-input of the flip-flop FF21, while Q-outputs of the flip-flops FF21 to FF32 are input to the detector 221. A Q-output of the flip-flop FF32 is connected to one input terminal of the OR gate OR21.

The other input terminal of the OR gate OR21 is connected to an output line of the correction signal S225-1 of the judgement circuit 225, while an output terminal is connected to a D-input of the flip-flop FF33. A Q-output of the flip-flop FF33 is connected to one input terminal of the AND gate AD21.

The other input terminal (negative input terminal) of the AND gate AD21 is connected to an output line of a correction signal S225-2 of the judgement circuit 225, while an output terminal is connected to one input terminal of the OR gate OR22.

The other input terminal of the OR gate OR22 is connected to an output line of the correction signal S225-3 of the judgement circuit 225, while an output terminal is connected to a D-input of the flip-flop FF34. The Q-output of the flip-flop FF34 is connected to one input terminal of the AND gate AD22.

The other input terminal (negative input terminal) of the AND gate AD22 is connected to an output line of a correction signal S225-4 of the judgement circuit 225, while an output terminal is connected to the D-input of the flip-flop FF35. The Q-output of the flip-flop FF35 is connected to one input terminal of the AND gate AD23.

The other input terminal (negative input terminal) of the AND gate AD23 is connected to an output line of a correction signal S225-5 of the judgement circuit 225, while an output terminal is connected to a D-input of the flip-flop FF36. The Q-output of the flip-flop FF36 is connected to one input terminal of the OR gate OR23.

The other input terminal of the OR gate OR23 is connected to an output line of the correction signal S225-6 of the judgement circuit 225, while an output terminal is connected to the D-terminal of the flip-flop FF37.

The Q-outputs of the flip-flops FF33, FF34, and FF35 are input to the detector 212.

Furthermore, Q-outputs and D-inputs of the flip-flops FF37 to FF48 are connected in cascade, the Q-outputs of the flip-flops FF36 to FF48 are input to the detector 233, and the Q-output of the flip-flop FF48 is output as a corrected signal to the next fourth correction circuit 1215.

The detector 221 detects a back 3T to 11T from the Q-outputs of the flip-flops FF21 to FF32 and outputs the detection result as a signal S221 to the judgement circuit 225. For example, when 3T to 11T is detected, a signal S221 of for example a high level is output.

The 2T detector 222 outputs a signal S222 of for example a high level to the judgement circuit 225 when a back 2T is detected from the Q-outputs of the flip-flops FF33, FF34, and FF35.

The detector 223 detects a front 3T to 11T from the Q-outputs of the flip-flops FF37 to FF48 and outputs the detection result as a signal S223 to the judgement circuit 225. For example, when 3T to 11T is detected, a signal S223 of for example a high level is output.

The phase error operation circuit 224, based on the result of detection by the digital PLL circuit 111 using a reference clock HIF of 4.3218 MHz×8(=34.5744 MHz) during normal-speed operation and 4.3218 MHz×6(=25.9308 MHz) during double-speed operation, that is, a 3-bit phase error information S111, compares the magnitudes of values of A and B, where A is the back edge of the EFM signal and B is the front edge when 2T is detected by the 2T detector 222, at a timing when there are phase errors of the edges A and B, and uses the operational result to output to the judgement circuit 225 a signal S224 for determining the direction of correction of 2T to 3T in accordance with the conditions shown in FIG. 11.

For example, as shown in FIG. 11, when a front edge has a phase advance of +4(100) and a back edge has a phase advance of +2(010), the signal is extended by 1T in front.

Also, when a front edge has a phase advance of +2(010) and a back edge has a phase delay of −3(101), the signal is extended by 1T in back.

In this way, whether to extend the signal by 1T in front or 1T in back is, as shown in FIG. 11, made conditional on the content of the phase error information S111.

Also, the portions with circles to the right in FIG. 11 show conditions enabling selection of the front or back direction.

Note that the present circuit enables selection of correction in the front or back direction when A=B because the correction direction changes depending on the state of skew in some cases.

The judgement circuit 225 outputs correction signals S225-1 to S225-6 at a predetermined level in accordance with the input levels of the detection signals SS221, S222, and S223 from the detectors 221, 222, and 223 and a correction direction instruction signal S224 of 2T→3T from the phase error operation circuit 224 in order to remove 2T or correct the front or back direction in accordance with an instruction signal.

For example, when correcting in the front direction, the correction signals S225-3, S225-4, 5225-5, and S225-6 are output at a high level and the correction signals 5225-1 and S225-2 are output at a low level.

Also, when correcting in the back direction, the correction signals S225-1, S225-2, and S225-4 are output at a high level and the correction signals S225-3, S225-5, and S225-6 are output at a low level.

When removing 2T, the correction signals S225-2 and S225-5 are output at a high level and the correction signals S225-1, S225-3, S225-4, and S225-6 are output at a low level.

Next, first, second, and third correction operations of the third correction circuit 1214 having the above configuration will be explained in order.

(1) Correction using Phase Error from PLL

In the DSP circuit 10, a reference clock HIF shown in FIG. 9A obtained by multiplying the playback clock PCK shown in FIG. 9C in accordance with the operation mode is generated by the digital PLL circuit 111 based on the EFM signal converted to a binary format shown in FIG. 9D in the PLL asymmetry correction circuit 11.

Note that, in the example of FIG. 9, the case is shown where the reference clock HIF is generated as a clock of 8 times the playback clock PCK (4.3218 MHz×8 during normal speed operation).

In the digital PLL circuit 111, when synchronizing the EFM signal and the playback clock PCK, a phase error amount is detected using the reference clock HIF.

The relationship of the phases of the EFM signal and the playback clock PCK is shown in FIG. 9B.

When the EFM signal shown in FIG. 9D is input for synchronization, it is detected as 2T as shown in FIG. 9E.

Assume that the back edge is A and the front edge is B in the EFM signal when 2T is detected.

Then, the relationship of the phase error and the values obtained from the digital PLL circuit 111 becomes as follows. The parenthesized 3-bit information is output as phase error information S111 to the correction portion 12.

| During Normal Speed Operation | |
|---|---|
| Phase advance | +4(100) |
| Phase advance | +3(011) |
| Phase advance | +2(010) |
| phase advance | +1(001) |
| No phase difference | 0(000) |
| Phase delay | −1(111) |
| Phase delay | −2(110) |
| Phase delay | −3(101) |

The phase error information S111 obtained from the digital PLL circuit 111 is input to the 2T EFM edge operation circuit 224 and the following is carried out.

Namely, the value of the phase difference of the front edge appears at the timing of FIG. 9G for the edges when 2T is detected in the 2T detector 222. The signal shown in FIG. 9G delayed by 2 playback clocks PCK is shown in FIG. 9I.

The values of A and B are compared at a timing where there are phase errors of the edges A and B.

Then, using the operation results shown in FIG. 9J, the direction of correction of 2T to 3T is determined in accordance with the conditions shown in FIG. 11.

Based on the results of FIG. 11, a signal of the correction direction is sent to the 2T→3T judgement circuit 225 and 2T is corrected to 3T in the EFM signal shown in FIG. 9D.

(2) Correction by Comparing Lengths of T's in Front and in Back

Next, correction other than the above correction (1) when 2T appears will be explained with reference to the timing chart of FIG. 10.

Here, correction when a consecutive pattern mT-2T-nT including 2T is input will be explained (m and n are integers between 3 and 11).

The signal before edge detection of the EFM signal shown in FIG. 10B becomes as shown in FIG. 10G after edge detection.

The signal is input to the third correction circuit 1214 where it is shifted by the clock period of the playback clock PCK from a register for detecting 3T to 11T in back of the 2T.

Then, as shown in FIG. 10D, when 2T to be corrected detected, if a back or front 3T to 11T is detected, the magnitudes of the back mT and the front nT are compared and the 2T is corrected to 3T under the following conditions:

Content of correction m>n (mT-2T-nT→(m−1)T-3T-nT)

Content of correction m<n (mT-2T-nT→mT-3T-(n−1)T)

In the example in FIG. 10, when m=5T and n=6T, m>n and the back correction signal shown in FIG. 10E becomes valid in the 2T removal judgement circuit 225.

As a result, the correction result as shown in FIG. 10F is obtained.

The corrected EFM signal after modulation in the later EFM modulation circuit 1217 becomes a signal of 5T-3T-5T as shown in FIG. 10G.

Namely, an EFM signal of a consecutive pattern 6T-2T-5T including 2T is corrected to a signal of 5T-3T-5T by the third correction circuit 1214.

Note that in the present circuit, since the case wherein m=n occurs, it is possible to set front or back correction when m=n.

(3) Coercive Correction to 3T when 2T Appears

When a signal passing through the first correction circuit 1212 and the second correction circuit 1213 is detected by the 2T detector 222, coercive correction from 2T to 3T is carried out as follows:

(3-1) The 2T is coercively corrected to 3T. Note that the correction direction, that is, the front or back direction, may be selected.

(3-2) The 2T is coercively corrected to 3T. The correction is repeated by alternately switching between the front direction and back direction every time 2T is detected.

Next, the configuration and the function of the fourth correction circuit 1215 will be explained.

Figure 12:
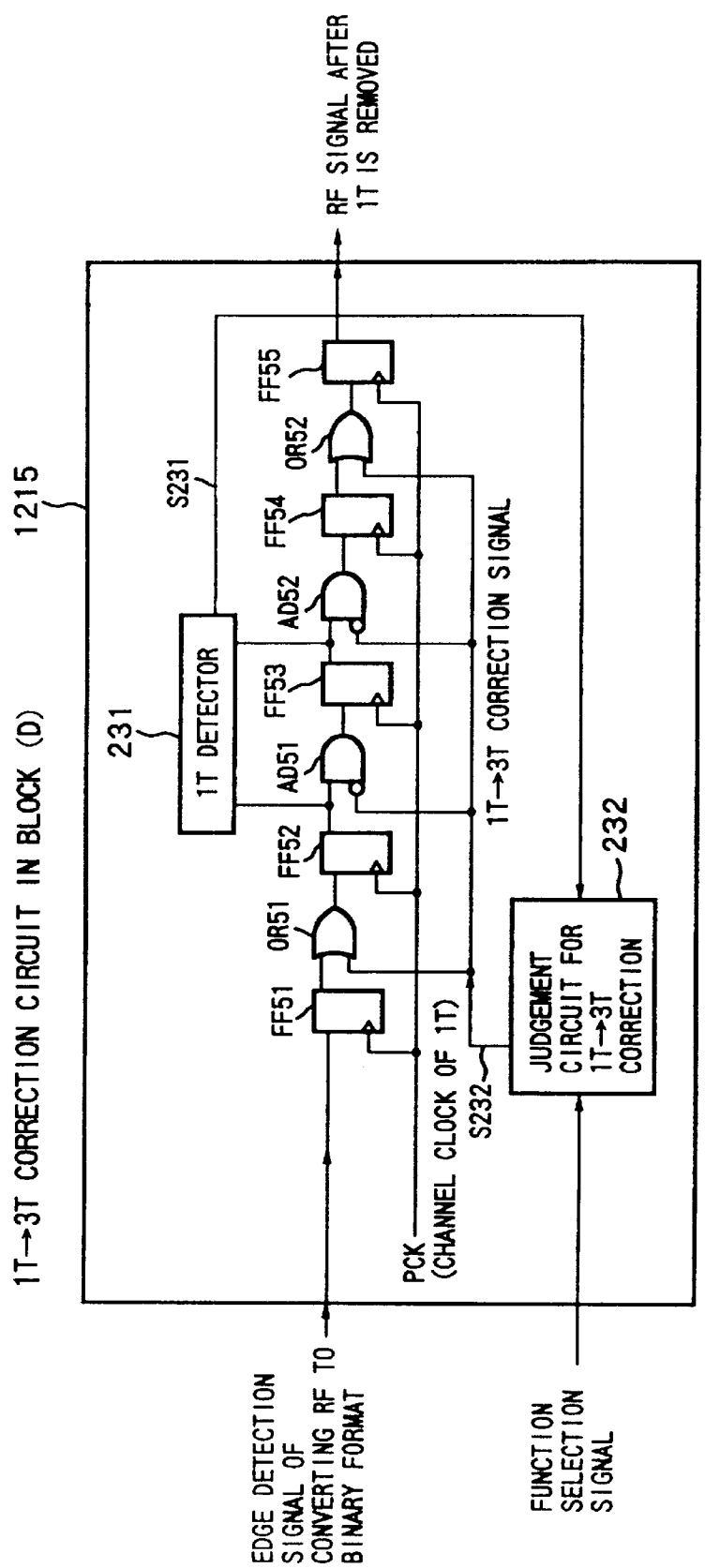
FIG. 12 is a circuit diagram of an example of the configuration of a fourth correction circuit in FIG. 3.

FIG. 12 is a circuit diagram of an example of the configuration of the fourth correction circuit 1215, and FIG. 13 is a timing chart of FIG. 12.

The fourth correction circuit 1215 extends any detected remaining 1T in a signal passing through the first correction circuit 1212, second correction circuit 1213, and third correction circuit 1214 by 1T in the front and back directions to correct the 1T to 3T.

The fourth correction circuit 1215 comprises, as shown in FIG. 12, D-type flip-flops FF51 to FF55, 2-input AND gates AD51 and AD52, 2-input OR gates OR51 and OR52, a 1T detector 231, and 1T→3T correction judgement circuit 232.

A playback clock (a channel clock of 1T) PCK generated in the digital PLL circuit 111 of the PLL asymmetry circuit 11 is supplied to clock CK terminals of the flip-flops FF51 to FF55.

Then, a signal S1211 (an output signal of the third correction circuit 1214) edge-detected at the NRZ conversion/edge detection circuit 1211 is input to the D-input of the flip-flop FF51, while a Q-output of the flip-flops FF51 is connected to one input terminal of the OR gate OR51.

The other input terminal of the OR gate OR51 is connected to an output line of the correction signal S232 of the judgement circuit 232, while an output terminal is connected to a D-input of the flip-flop FF52. The Q-output of the flip-flop FF52 is connected to one input terminal of the AND gate AD51.

The other input terminal (negative input terminal) of the AND gate AD51 is connected to an output line of a correction signal S232 of the judgement circuit 232 and connected to D-input of the flip-flop FF53. The Q-output of the flip-flop FF53 is connected to one input terminal of the AND gate AD52.

The other input terminal (negative input terminal) of the AND gate AD52 is connected to an output line of a correction signal S232 of the judgement circuit 232, while an output terminal is connected to the D-input of the flip-flop FF54. The Q-output of the flip-flop FF54 is connected to one input terminal of the OR gate OR52.

The other input terminal of the OR gate OR52 is connected to an output line of the correction signal S232 of the judgement circuit 232, while an output terminal is connected to a D-input of the flip-flop FF55.

The Q-output of the flip-flop FF55 is output as a corrected signal to the EFM modulation circuit 1217 via the selector 1216.

The Q-outputs of the flip-flops FF52 and FF53 are input to the 1T detector 231.

The 1T detector 231 detects 1T from the Q-outputs of the flip-flops FF52 and FF53 and outputs the detection result as a signal S231 to the judgement circuit 232. For example, when 1T is detected, a signal S231 is output at a high level.

When the detection signal S231 from the detector 231 is input at a high level, the judgement circuit 232 outputs a 1T→3T correction signal S232 to the other input terminals of the OR gates OR51 and OR52 and the other input terminals (negative input terminal) of the AND gates AD51 and AD52 in order to correct 1T to 3T.

Next, the correction operation of the fourth correction circuit 1215 having the above configuration will be explained.

A signal before edge detection of the EFM signal shown in FIG. 13B becomes as shown in FIG. 13C after edge detection.

This signal is input to the fourth correction circuit 1215 where it is shifted by the clock period of the playback clock PCK from a register.

When 1T to be corrected is detected, as shown in FIG. 13D, correction from 1T to 3T is carried out.

The corrected EFM signal after modulation in the later EFM modulation circuit 1217 becomes 3T-3T-3T as shown in FIG. 13D.

Namely, the EFM signal of a consecutive pattern 4T-1T-4T including 1T is corrected to a signal of 3T-3T-3T by the fourth correction circuit 1215.

Note that correction can be turned on and off in the fourth correction circuit 1215 by giving a function selection signal.

Next, the operation of the circuit of FIG. 1 will be explained.

The disk 1 storing information using code modulation is driven to rotate by the spindle motor 2, and the information stored on the disk 1 is read by an optical pickup 3.

An output signal of the optical pickup 3 is converted from a current signal to a voltage signal by the I(current)/V (voltage) amplifier 8, shaped in waveform by the RF equalizing circuit 9, and supplied as an RF signal to the DSP circuit 10.

In the DSP circuit 10, the RF signal from the RF equalizer 9 is input to the PLL asymmetry correction circuit 11 where the RF signal is corrected for asymmetry and then output as a binary RF signal (EFM signal) to the EFM block 12.

Furthermore, in the PLL asymmetry correction circuit 11, a playback clock PCK having a frequency of 4.3218 MHz is generated based on the binary signal edge (binary pulse series signal). Then in the digital PLL circuit 111, a reference clock HIF of a whole multiple of the playback clock PCK is generated based on the binary EFM signal. When synchronizing the EFM signal and the PCK signal, the amount of phase error is detected by using the reference clock HIF. The phase error of the RF signal is supplied as 3-bit phase error information S111 to the correction portion 121 of the EFM block 12.

The correction portion 121 corrects 1T or 2T signals included in the EFM signals, which inherently cannot exist and had become regarded as errors in format due to fine scratches on the surface of the disk 1 using code modulation or for example deviation of the comparison level in the RF equalizer 9, to a 0 or 3T signal in accordance with a predetermined mode.

More specifically, edge detection is carried out on the RF signal converted to a binary format at the PLL asymmetry correction circuit 11 and NRZ conversion is performed. Then, the signal is synchronized by using a clock generated in the digital PLL circuit 111, the first to fourth correction circuits 1212 to 1215 detect 1T or 2T (T is a channel clock period) which inherently cannot exist as EFM signals in format generated at the time of synchronization, and the detected 1T or 2T signal is corrected to 0 or 3T in accordance with predetermined conditions.

The signal corrected in the first to fourth correction circuits 1212 to 1215 of the correction portion 12 is input to the EFM modulation circuit 1217 via a selector 1216 and modulated by EFM. The signal after the EFM modulation is demodulated in the EFM demodulation circuit 122.

Then the demodulated EFM signal becomes digital audio data and error correction and detection parity bits. A sub-code immediately behind the frame synchronization signal is demodulated. The sub-code is supplied to the controller 20 via the sub-code processing circuit 13.

Also, the data after the EFM demodulation is temporarily stored in the RAM 14 and error correction is carried out by the error correction circuit 15 based on the error correction/ detection parity bits.

The data after the error correction is deinterleaved in CIRC (Cross Interleave Reed-Solomon Code) in the deinterleave circuit 16 and output as an audio signal of L/R ch.

As explained above, according to the present embodiment, since provision is made of an EFM block 12 containing a correction portion 121 for detecting an edge of an RF signal converted to a binary format by the PLL asymmetry correction circuit 11 for NRZ conversion, using a clock generated in the digital PLL circuit 11 for synchronization, detecting 1T and 2T (T is a channel clock period), which inherently cannot exist as EFM signals in format, generated at the time of synchronization, correcting the detected 1T and 2T signals to 0 or 3T in accordance with predetermined conditions to remove the 1T and 2T from the RF signal, and modulating the RF signal from which the 1T and 2T have been removed by EFM and a demodulation circuit 122 for demodulating by EFM a signal after modulation by EFM, a signal which had been treated as an error up to now can be restored. Since the signals to be corrected in the error correction circuit 15 are corrected to a format from 3T to 11T, the C1 and C2 error rates are improved and the playability is improved.

There is therefore the advantage that the error rate can be improved and the playability improved.

Furthermore, 1T and 2T signals generated as a result of the amplitude level of the RF signal declining and the RF signal not being correctly input due to fine scratches on the disk surface or as a result of the slice level ending up being shifted to the plus or minus side due to deviation in asymmetry and the signal not being correctly converted to a binary format can be removed.

Therefore, there is the advantage that it is possible to improve the playability of poor-quality disks such as disks having asymmetry deviation and scratched disks.

Note that in the present embodiment, the correction portion 121 was configured to input a signal passing through the third correction circuit 1214 for 2T→3T correction to the fourth correction circuit 1215 for 1T→3T correction. However, it may also be configured to input a signal passing through the second correction circuit 1213 to the fourth correction circuit 1215 and input a signal passing through the fourth correction circuit 1215 to the third correction circuit 1214 for 2T→3T correction.

In this case, it is also possible to use a not shown switching circuit to switch between the connection mode of the second correction circuit 1213→third correction circuit 1214→fourth correction circuit 1215 and the connection mode of the second correction circuit 1213→fourth correction circuit 1215→third correction circuit 1214 by a control signal.

By providing a function for switching the correction order in this way, there is the advantage that it is possible to reduce deterioration of the correction result when the state of appearance of 1T and 2T changes due to the disk playback state.

Summarizing the effects of the invention, as explained above, according to the present invention, there is the advantage that signals which had been regarded as errors before can be restored by correcting the generated 1T and 2T signals. Therefore, the signals to be corrected in the error correction circuit are corrected to a format between 3T and 11T, so there is the advantage that the error rate and playability can be improved.

Furthermore, 1T and 2T signals generated as a result of the amplitude level of the RF signal declining and the RF signal not being correctly input due to fine scratches on the disk surface or as a result of the slice level ending up being shifted to the plus or minus side due to deviation in asymmetry and the signal not being correctly converted to a binary format can be removed.

Therefore, there is the advantage that it is possible to improve the playability of poor-quality disks such as disks having asymmetry deviation and scratched disks.

Further, by providing a function for switching the correction order and a means for selection of the correction function, there is the advantage that it is possible to reduce deterioration of the correction result when the state of appearance of 1T and 2T changes due to the disk playback state.

While the invention has been described with reference to specific embodiment chosen for purpose of illustration, it should be apparent that numerous modifications could be made thereto by those skilled in the art without departing from the basic concept and scope of the invention.

What is claimed is:

1. A decoding apparatus for decoding a code which has a consecutive length, said length being a length of symbols arranged consecutively between identical other symbols of a code series formed by two symbols, defined as a predetermined defined length and which has a minimum inversion interval of 3T in the absence of errors, where T is a bit interval of a channel bit series, comprising:

detecting means for detecting from the code series a pattern of T's which has a minimum inversion interval of smaller than 3T due to errors; and correcting means for correcting any of said pattern of T's having a minimum inversion interval of smaller than 3T detected by said detecting means to signals of a normal format of 3T or more.

2. A decoding apparatus as set forth in claim 1, wherein said detecting means detects a pattern of consecutive T's including 1T and said correcting means removes a 1T portion to correct any detected pattern of consecutive T's including 1T to signals of a normal format of 3T or more.

3. A decoding apparatus as set forth in claim 1, wherein said detecting means detects a pattern of consecutive T's including 1T and said correcting means corrects an 1T portion of any detected pattern of consecutive T's including 1T to 3T.

4. A decoding apparatus as set forth in claim 1, wherein said detecting means detects a consecutive pattern including 1T and said correcting means corrects any detected consecutive pattern including 1T to signals of any format of 3T or more.

5. A decoding apparatus as set forth in claim 1, wherein said detecting means detects a pattern of consecutive T's including 1T and 2T and said correcting means corrects any detected pattern of consecutive T's including 1T and 2T to signals of any format of 3T or more.

6. A decoding apparatus as set forth in claim 1, wherein said detecting means detects a pattern of consecutive T's including 2T and said correcting means removes the 2T portion to correct any detected pattern of consecutive T's including 2T to signals of a normal format of 3T or more.

7. A decoding apparatus as set forth in claim 1, wherein said detecting means detects a pattern of consecutive T's including 2T and said correcting means corrects a 2T portion of any detected pattern of consecutive T's including 2T to 3T.

8. A decoding apparatus as set forth in claim 1, wherein said detecting means detects a consecutive pattern including 2T and said correcting means corrects any detected consecutive pattern including 2T to signals of any format of 3T.

9. A decoding apparatus as set forth in claim 1, wherein said correcting means compares the lengths of T's in front of and in back of the 2T portion of any detected 2T and corrects the 2T to the longer side.

10. A decoding apparatus as set forth in claim 1, wherein said correcting means compares phase errors of edges of binary signals of 2T, determines in accordance with the comparison results whether to correct a 2T portion in a direction in front of, or in back of, the 2T portion, and corrects the 2T to 3T in the determined direction.

11. A decoding apparatus as set forth in claim 1, wherein said correcting means coercively extends any detected 2T portion by 1T in front of or in back of it to correct it to 3T.

12. A decoding apparatus as set forth in claim 11, wherein said correcting means coercively extends every detected 2T by 1T alternately in the direction in front of and in back of it.

13. A decoding apparatus as set forth in claim 1, wherein said correcting means coercively extends any detected 1T by 1T in front of and in back of it to correct it to 3T.

14. A decoding apparatus as set forth in claim 1, wherein said correcting means comprises:

a first correction circuit for removing any detected 1T to correct the 1T portion to signals of a normal format of 3T or more;

a second correction circuit for correcting any 2T portion detected from output signals of said first correction circuit to 3T;

a third correction circuit for comparing phase errors of edges of binary signals of any detected 2T, determining in accordance with the comparison results whether to correct the 2T portion in a direction in front of, or in back of, the 2T portion, and correcting the 2T to 3T in the determined direction; and a fourth correction circuit for correcting any 1T portion detected from output signals of said third correction circuit to 3T.

15. A decoding apparatus as set forth in claim 14, comprising a means enabling switching of connection of positions of signal lines of said third correction circuit and said fourth correction circuit between an output of said second correction circuit and an output of the correcting means.

16. A data reproduction apparatus for reproducing code data which has a consecutive length, said length being a length of symbols arranged consecutively between identical other symbols of a code series formed by two symbols, defined as a predetermined defined length and which has a minimum inversion interval of 3T in the absence of errors, where T is a bit interval of a channel bit series stored on a predetermined storage medium, comprising:

means for reproducing an RF signal from said storage medium;

detecting means for detecting from the reproduced RF signal a pattern of T's which has a minimum inversion interval of smaller than 3T due to errors;

correcting means for correcting any of said pattern of T's having a minimum inversion interval of smaller than 3T detected by said detecting means to signals of a normal format of 3T or more; and an error correction circuit for correcting errors in the signals corrected by said correcting means.

17. A data reproduction apparatus as set forth in claim 16, wherein said detecting means detects a pattern of consecutive T's including 1T and said correcting means removes a 1T portion of any detected pattern of consecutive T's including 1T to correct it to signals of a normal format of 3T or more.

18. A data reproduction apparatus as set forth in claim 16, wherein
   said detecting means detects a pattern of consecutive T's including 1T and
   said correcting means corrects a 1T portion of any detected pattern of consecutive T's including 1T to 3T.

19. A data reproduction apparatus as set forth in claim 16, wherein
   said detecting means detects a consecutive pattern including 1T and
   said correcting means corrects any detected consecutive pattern including 1T to signals of any format of 3T or more.

20. A data reproduction apparatus as set forth in claim 16, wherein
   said detecting means detects a pattern of consecutive T's including 1T and 2T and
   said correcting means corrects any detected pattern of consecutive T's including 1T and 2T to signals of any format of 3T or more.

21. A data reproduction apparatus as set forth in claim 16, wherein
   said detecting means detects a pattern of consecutive T's including 2T and
   said correcting means removes the 2T portion of any detected pattern of consecutive T's including 2T to correct it to signals of a format of 3T or more.

22. A data reproduction apparatus as set forth in claim 16, wherein
   said detecting means detects a pattern of consecutive T's including 2T and
   said correcting means corrects the 2T portion of any detected pattern of consecutive T's including 2T to 3T.

23. A data reproduction apparatus as set forth in claim 16, wherein
   said detecting means detects a consecutive pattern including 2T and
   said correcting means corrects any detected consecutive pattern including 2T to signals of any format of 3T or more.

24. A data reproduction apparatus as set forth in claim 16, wherein
   said correcting means compares the lengths of T's in front of and in back of the 2T portion of any detected 2T and corrects the portion to the longer side.

25. A data reproduction apparatus as set forth in claim 16, wherein
   said correcting means compares phase errors of edges of binary signals of 2T, determines in accordance with the comparison results whether to correct the 2T portion in a direction in front of, or in back of, the 2T portion and corrects the 2T to 3T in the determined direction.

26. A data reproduction apparatus as set forth in claim 16, wherein
   said correcting means coercively extends any detected 2T portion by 1T in front of or in back of it to correct it to 3T.

27. A data reproduction apparatus as set forth in claim 26, wherein
   said correcting means coercively extends every detected 2T by 1T alternately in the direction in front of and in back of it.

28. A data reproduction apparatus as set forth in claim 16, wherein
   said correcting means coercively extends any detected 1T by 1T in front of and in back of it to correct it to 3T.

29. A data reproduction apparatus as set forth in claim 16, wherein said correcting means comprises:
   a first correction circuit for removing any detected 1T to correct the 1T portion to signals of a normal format of 3T or more;
   a second correction circuit for correcting any 2T portion detected from output signals of said first correction circuit to 3T;
   a third correction circuit for comparing phase errors of edges of binary signals of any detected 2T, determining in accordance with the comparison results whether to correct the 2T portion in a direction in front of, or in back of, the 2T portion, and correcting the 2T to 3T in the determined direction; and
   a fourth correction circuit for correcting any 1T portion detected from output signals of said third correction circuit to 3T.

30. A data reproduction apparatus as set forth in claim 29, comprising
   a means enabling switching of connection of positions of signal lines of said third correction circuit and said fourth correction circuit between an output of said second correction circuit and an output of the correcting means.

31. A decoding method for decoding a code which has a consecutive length, said length being a length of symbols arranged consecutively between identical other symbols of a code series formed by two symbols, defined as a predetermined defined length and which has a minimum inversion interval of 3T in the absence of errors, where T is a bit interval of a channel bit series, comprising:
   detecting from the code series a pattern of T's which has a minimum inversion interval of smaller than 3T due to errors; and
   correcting any detected pattern of T's having a minimum inversion interval of smaller than 3T to signals of a normal format of 3T or more.

32. A decoding method as set forth in claim 31, further comprising
   removing a 1T portion of any detected pattern of consecutive T's including 1T to correct it to signals of a normal format of 3T or more.

33. A decoding method as set forth in claim 31, further comprising
   correcting a 1T portion of any detected pattern of consecutive T's including 1T to 3T.

34. A decoding method as set forth in claim 31, further comprising
   a correcting any detected consecutive pattern including 1T to signals of any format of 3T or more.

35. A decoding method as set forth in claim 31, further comprising
   correcting any detected pattern of consecutive T's including 1T and 2T to signals of any format of 3T or more.

36. A decoding method as set forth in claim 31, further comprising
   removing the 2T portion of any detected pattern of consecutive T's including 2T to correct it to signals of a format of 3T or more.

37. A decoding method as set forth in claim 31, further comprising
   correcting the 2T portion of any detected pattern of consecutive T's including 2T to 3T.

38. A decoding method as set forth in claim 31, further comprising correcting any detected consecutive pattern including 2T to signals of any format of 3T or more.

39. A decoding method as set forth in claim 31, further comprising comparing the lengths of T's in front of and in back of the 2T portion of any detected 2T and correcting the portion to the longer side.

40. A decoding method as set forth in claim 31, further comprising comparing phase errors of edges of binary signals of 2T, determining in accordance with the comparison results whether to correct a 2T portion in a direction in front of, or in back of, the 2T portion, and correcting the 2T to 3T in the determined direction.

41. A decoding method as set forth in claim 31, further comprising coercively extending any detected 2T portion by 1T in front of or in back of it to correct it to 3T.

42. A decoding method as set forth in claim 41, further comprising coercively extending every detected 2T by 1T alternately in the direction in front of and in back of it.

43. A decoding method as set forth in claim 31, further comprising coercively extending any detected 1T by 1T in front of and in back of it to correct it to 3T.

* * * * *